United States Patent
Joei

(10) Patent No.: US 9,614,010 B2
(45) Date of Patent: Apr. 4, 2017

(54) SOLID-STATE IMAGE SENSING DEVICE HAVING AN ORGANIC PHOTOELECTRIC CONVERSION SECTION FILLS A DEPRESSION SECTION AND SOLID-STATE IMAGE PICKUP UNIT INCLUDING SAME

(71) Applicant: SONY CORPORATION, Tokyo (JP)

(72) Inventor: Masahiro Joei, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 103 days.

(21) Appl. No.: 14/654,435

(22) PCT Filed: Dec. 17, 2013

(86) PCT No.: PCT/JP2013/007409
§ 371 (c)(1),
(2) Date: Jun. 19, 2015

(87) PCT Pub. No.: WO2014/103240
PCT Pub. Date: Jul. 3, 2014

(65) Prior Publication Data
US 2015/0311259 A1 Oct. 29, 2015

(30) Foreign Application Priority Data
Dec. 26, 2012 (JP) .................................. 2012-282107

(51) Int. Cl.
*H01L 27/146* (2006.01)
*H01L 27/30* (2006.01)
*H04N 5/376* (2011.01)
*H04N 5/378* (2011.01)

(52) U.S. Cl.
CPC ...... *H01L 27/307* (2013.01); *H01L 27/14636* (2013.01); *H01L 27/14647* (2013.01); *H04N 5/376* (2013.01); *H04N 5/378* (2013.01)

(58) Field of Classification Search
CPC ............... H01L 27/146; H01L 27/1464; H01L 2224/02331; H01L 27/14621; H01L 29/4966
USPC ........................ 250/208.1, 214 R, 239, 214.1
See application file for complete search history.

(56) References Cited

U.S. PATENT DOCUMENTS

| 9,276,043 B2 * | 3/2016 | Fujii .................. H01L 27/14627 |
| 2009/0322923 A1 | 12/2009 | Maehara |
| 2011/0019042 A1 | 1/2011 | Yamaguchi |

FOREIGN PATENT DOCUMENTS

JP 2011-029337 A 2/2011

* cited by examiner

*Primary Examiner* — Que T Le
(74) *Attorney, Agent, or Firm* — Chip Law Group

(57) ABSTRACT

Image sensors, image pickup devices, and electronic apparatuses are provided. These can include an image sensor or image pickup device that includes a first insulating layer over a semiconductor substrate. A depression section is formed in the first insulating layer. An organic photoelectric conversion section fills the depression section. One or more inorganic photoelectric conversion sections can also be provided, with the organic photoelectric conversion section overlapping the inorganic photoelectric conversion sections. Alternatively or in addition, the depression section can taper from a side adjacent a light receiving side of the image sensor to a side adjacent the at least a first inorganic photoelectric conversion section.

21 Claims, 19 Drawing Sheets

SOLID-STATE IMAGE SENSING DEVICE HAVING AN ORGANIC PHOTOELECTRIC CONVERSION SECTION FILLS A DEPRESSION SECTION AND SOLID-STATE IMAGE PICKUP UNIT INCLUDING SAME

TECHNICAL FIELD

The present technology relates to a solid-state image sensing device having a photoelectric conversion section including an organic material, and a solid-state image pickup unit provided with the solid-state image sensing device.

BACKGROUND ART

In a solid-state image pickup unit such as a CCD (Charge Coupled Device) image sensor and a CMOS (Complementary Metal Oxide Semiconductor) image sensor, the number of photons entering a unit pixel (a solid-state image sensing device) decreases as a pixel size shrinks, and an S/N ratio declines. As represented by, for example, a Bayer array and the like, pixels are divided into red, green, and blue colors by using color filters, and arranged on the same plane. In this technique, for example, light with wavelengths of green and blue is not allowed to pass through a red pixel (a color filter) and thus, a loss of light occurs, and sensitivity drops. In addition, a false color may be generated, because color signals are produced by performing interpolation processing between red, green, and blue pixels.

Thus, a method of obtaining photoelectric conversion signals of three colors with one pixel by laminating three photoelectric conversion sections has been suggested. For example, one of the three photoelectric conversion sections (e.g. the photoelectric conversion section corresponding to green light) is disposed on a silicon substrate, specifically, on the outside of the silicon substrate, and the remaining two (e.g. the photoelectric conversion sections corresponding to red light and blue light) are provided in the inside of the silicon substrate. The photoelectric conversion section on the outside of the silicon substrate includes an organic material, and is provided between a pair of electrodes. On the other hand, the photoelectric conversion section in the inside of the silicon substrate is configured of a photodiode (Photo Diode).

For example, in a solid-state image pickup unit of Japanese Unexamined Patent Application Publication No. 2011-29337 (PTL 1), a photoelectric conversion section including an organic material is provided on one surface of a silicon substrate, and a multilayer structure of a circuit and wiring (hereinafter simply referred to as "wiring layer") is provided on the other surface of the silicon substrate. In other words, this solid-state image pickup unit is of a so-called backside-illumination type in which a light-receiving surface and a circuit forming surface are disposed opposite each other. When the photoelectric conversion section and the wiring layer are thus disposed, the distance between the photoelectric conversion section on the outside of the silicon substrate and the photoelectric conversion section in the inside of the silicon substrate is short. Since sensitivity of the photoelectric conversion section depends on an F-number of an on-chip lens, reducing the distance between the laminated photoelectric conversion sections of the respective colors makes it possible to suppress unevenness of sensitivity with respect to each other.

CITATION LIST

Patent Literature

[PTL 1]
JP 2011-29337

SUMMARY

Technical Problem

In recent years, development of image pickup units having higher photoelectric conversion efficiency has been pursued. In particular, enhancement in photoelectric conversion efficiency of the photoelectric conversion section including organic material as described above has been expected.

It is desirable to provide a solid-state image sensing device having higher photoelectric conversion efficiency, and a solid-state image pickup unit provided with this solid-state image sensing device.

Solution to Problem

According to an embodiment of the present disclosure, there is provided an image sensor. The image sensor includes a first insulating layer over a semiconductor substrate. A depression section is formed in the first insulating layer. An organic photoelectric conversion section that fills the depression section is also provided.

In accordance with further embodiments, the image sensor includes at least a first inorganic photoelectric conversion section formed in the semiconductor substrate, wherein the organic photoelectric conversion section overlaps at least a first inorganic photoelectric conversion section. In addition, the depression section can taper from a side adjacent a light receiving side of the image sensor to a side adjacent the at least a first inorganic photoelectric conversion section.

In accordance with still further embodiments, the organic photoelectric conversion section includes a mixed layer that includes an n type semiconductor and a p type semiconductor. Alternatively or in addition, the organic photoelectric inversion section includes multiple layers. In an embodiment in which the organic photoelectric conversion section includes multiple layers, a first one of the layers of the organic photoelectric conversion section can be provided along a side wall and a bottom surface of the depression section adjacent the semiconductor substrate. In addition, the first one of the layers of the organic photoelectric conversion section can be an n-type semiconductor layer, and a second one of the layers of the organic photoelectric conversion section can be a mixed layer that includes an n-type semiconductor and a p-type semiconductor, while a third one of the layers of the organic photoelectric conversion section can be a p-type semiconductor layer. The image sensor can further include a second inorganic photoelectric conversion section formed in the semiconductor substrate, and the organic photoelectric conversion section can overlap the first and second inorganic photoelectric conversion sections.

In accordance with still other embodiments, the image sensor can include an upper electrode in contact with a top surface of the organic photoelectric conversion section, and a lower electrode in contact with a lower surface of the organic photoelectric conversion section, with the lower electrode between the organic photoelectric conversion section and the semiconductor substrate. In addition, the image sensor can include a storage layer that is formed in the semiconductor substrate, and that is electrically interconnected to the lower electrode. In accordance with still other embodiments, the image sensor can be a back illumination type image sensor in which the at least a first inorganic photoelectric conversion element is provided between a light receiving surface of the semiconductor substrate and a wiring layer.

In accordance with further embodiments of the present disclosure, an image pickup device is provided. The device includes an on-chip lens, and a flattening layer, with the on-chip lens provided on the flattening layer. The device also includes a solid-state image pickup device, having a first insulating layer over a semiconductor substrate, a depression section formed in the first insulating layer, and an organic photoelectric conversion section that fills the depression section.

In accordance with still other embodiments, the image pickup device also includes at least a first inorganic photoelectric conversion section formed in the semiconductor substrate, with the organic photoelectric conversion section overlapping the at least a first inorganic photoelectric conversion section, and in which the flattening layer is interconnected to the solid-state image pickup device. The depression section can taper from a side adjacent a light receiving side of the image sensor to a side adjacent the semiconductor substrate. Alternatively or in addition, the organic photoelectric conversion section can include a mixed layer that includes an n-type semiconductor and a p-type semiconductor.

In accordance with still other embodiments of the present disclosure, an electronic apparatus is provided. The apparatus includes an optical system, a shutter unit that receives light from the optical system, and an image pickup unit, wherein the shutter unit controls an optical irradiation period for the image pickup unit. The image pickup unit includes a first insulating layer over a semiconductor substrate, a depression section formed in the insulating layer, and an organic photoelectric conversion section that fills the depression section. The apparatus additionally includes a drive section that is operable to control operation of the shutter unit and transfer operations of the image pickup unit. In addition, the electronic apparatus can include a signal processing section, wherein the signal processing section is operable to perform signal processing on signals output from the image pickup unit.

In accordance with further embodiments, an electronic apparatus can include at least a first inorganic photoelectric conversion section formed in the semiconductor substrate, wherein the organic photoelectric conversion section overlaps the at least a first inorganic photoelectric conversion section. Alternatively or in addition, the depression section can taper from a side adjacent a light receiving side of the image sensor to a side adjacent the semiconductor substrate. The organic photoelectric conversion section can include a mixed layer with an n-type semiconductor and a p-type semiconductor. The organic photoelectric conversion section can include multiple layers. A first one of the multiple layers of the organic photoelectric conversion section can be provided along a side wall and a bottom surface of the depression section adjacent the semiconductor surface.

Advantageous Effects of Invention

According to the solid-state image sensing device and the solid-state image pickup unit in the respective embodiments of the present technology, the first photoelectric conversion section has a large thickness and thus, an optical path length thereof is allowed to be increased. Therefore, photoelectric conversion efficiency is allowed to be enhanced.

It is to be understood that both the foregoing general description and the following detailed description are exemplary, and are provided to provide further explanation of the present technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

DESCRIPTION OF EMBODIMENTS

An embodiment of the present technology will be described in detail with reference to the drawings. It is to be noted that the description will be provided in the following order:
1. Embodiment (an image pickup device: an example in which an organic photoelectric conversion section is provided in a depression section of an insulating layer);
2. Modification 1 (an example in which an organic photoelectric conversion section is provided at a position closer to a semiconductor substrate);
3. Modification 2 (an example in which a lower electrode is provided in a depression section);
4. Modification 3 (an example in which a hole is extracted from a lower electrode side as a signal charge);
5. Modification 4 (an example in which an electron or a hole is extracted from an upper electrode side as a signal charge);
6. Application Example (an image pickup unit).

(Embodiment)
Configuration of Image Pickup Device 10

Figure 1:
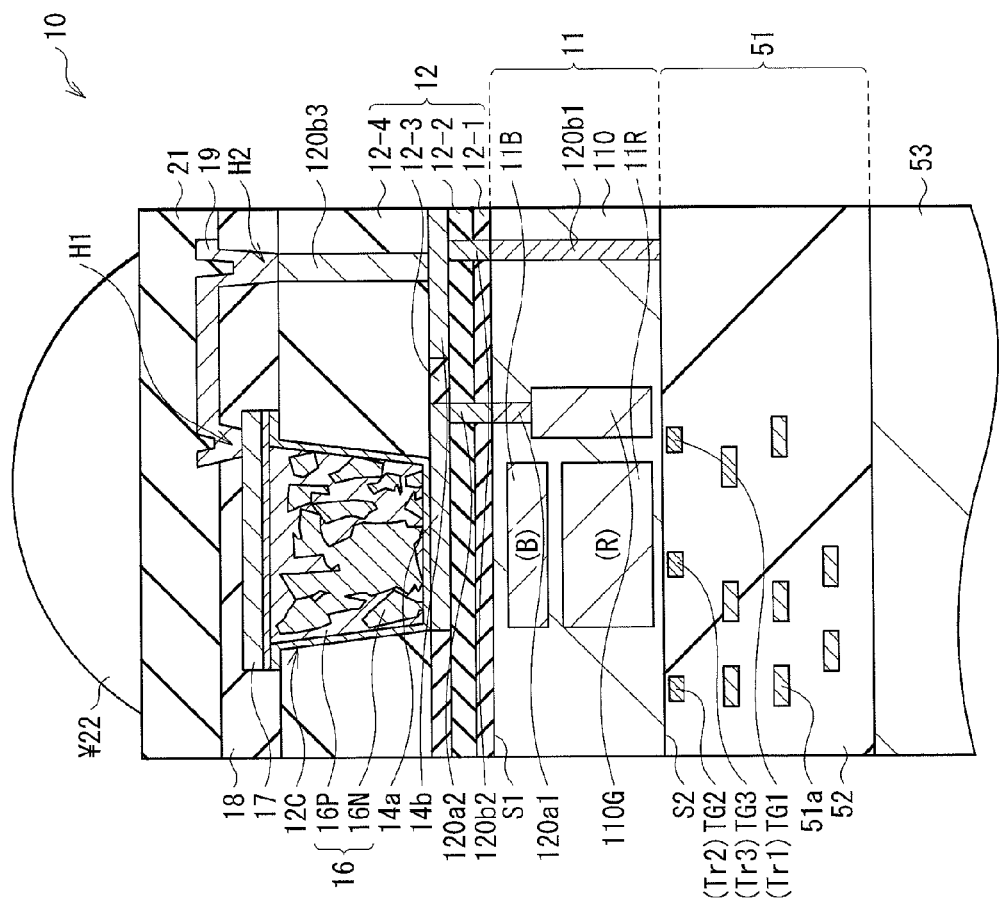
FIG. 1 is a cross-sectional diagram illustrating a schematic configuration of an image pickup device according to an embodiment of the present technology.

FIG. 1 illustrates a cross-sectional configuration of an image pickup device (an image pickup device 10) according to an embodiment of the present technology. The image pickup device 10 may form, for example, one pixel (for example, a pixel P in FIG. 20 described later) in an image pickup unit (e.g. an image pickup unit 1 in FIG. 20 described later) such as a CCD image sensor and a CMOS image sensor. The image pickup device 10 is of a backside-illumination type, in which a multilayered wiring layer 51 is provided on a surface (a surface S2) opposite to a light-receiving surface (a surface S1) of a semiconductor substrate 11.

The image pickup device 10 includes inorganic photoelectric conversion sections 11B and 11R (a second photoelectric conversion section) and an organic photoelectric conversion section 16 (a first photoelectric conversion section), which are laminated in a vertical direction (an optical path). The inorganic photoelectric conversion sections 11B and 11R are provided in the inside of the semiconductor substrate 11, and the organic photoelectric conversion section 16 is provided on the surface S1 of the semiconductor substrate 11. The organic photoelectric conversion section 16 is provided between a pair of electrodes (an upper electrode 17 and a lower electrode 14a), and light enters the organic photoelectric conversion section 16 from one electrode (the upper electrode 17) side. The organic photoelectric conversion section 16 and each of the inorganic photoelectric conversion sections 11B and 11R as described above selectively detect and photoelectrically convert light of wavelength regions different from each other. Therefore, it is possible to obtain a plurality of kinds of color signals with the single image pickup device 10, without providing a color filter. A color signal of red (e.g. with a wavelength of about 620 nm to about 750 nm both inclusive) is detected in the inorganic photoelectric conversion section 11R, a color signal of blue (e.g. with a wavelength of about 450 nm to about 495 nm both inclusive) is detected in the inorganic photoelectric conversion section 11B, and a color signal of green (e.g. with a wavelength of about 495 nm to about 570 nm) is detected in the organic photoelectric conversion section 16.

Figure 20:
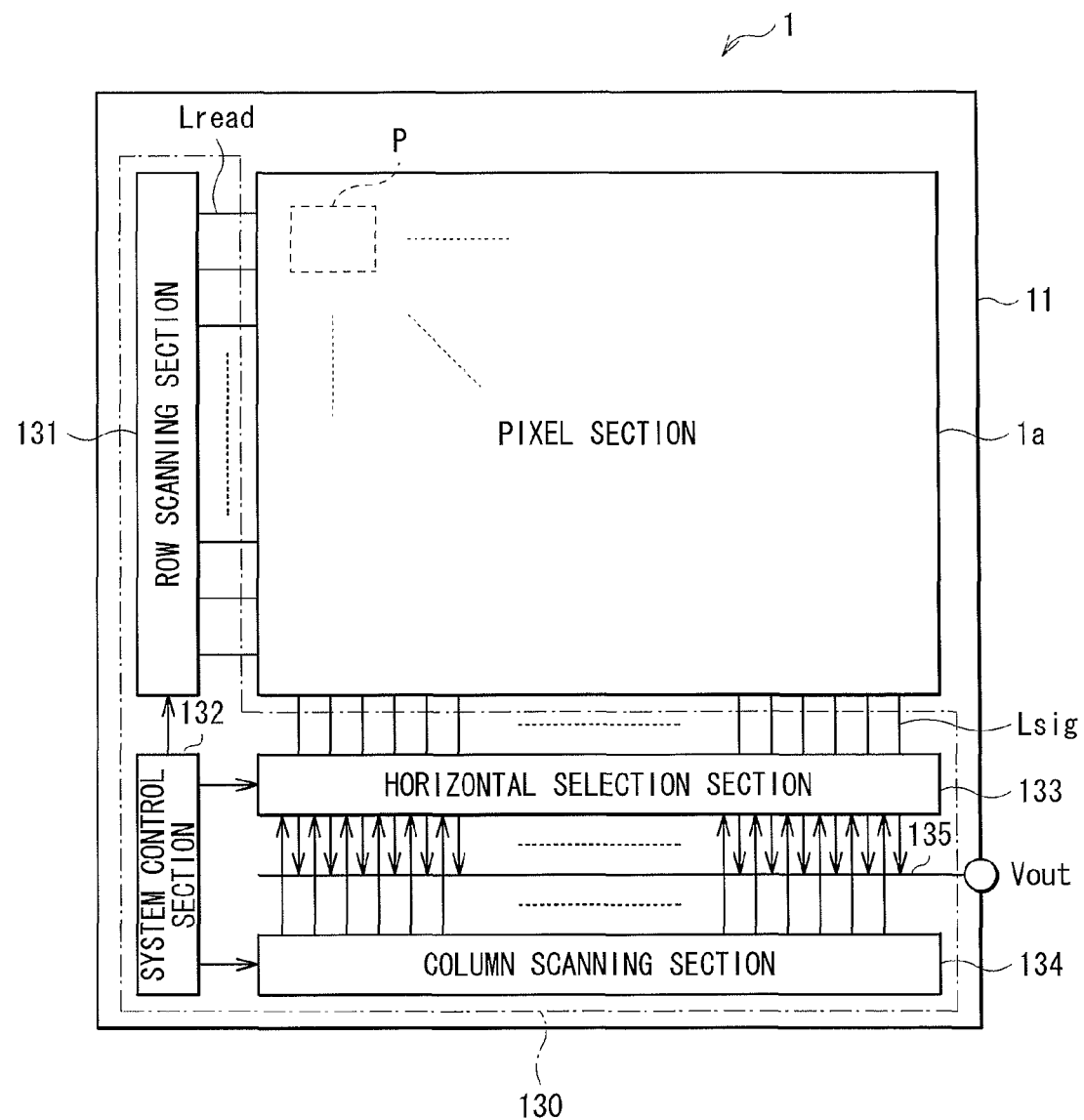
FIG. 20 is a schematic diagram illustrating an overall configuration of an image pickup unit using the image pickup device illustrated in FIG. 1.

A p-type semiconductor well region (not illustrated), for example, may be provided in proximity to the surface S2 of the semiconductor substrate 11. In proximity to the surface S2 of the semiconductor substrate 11, transfer transistors Tr1, Tr2, and Tr3 corresponding to the organic photoelectric conversion section 16, the inorganic photoelectric conversion section 11B, and the inorganic photoelectric conversion section 11R, respectively, are also provided. The transfer transistors Tr1, Tr2, and Tr3 may transfer a signal charge corresponding to green generated in the organic photoelectric conversion section 16, a signal charge corresponding to blue generated in the inorganic photoelectric conversion section 11B, and a signal charge corresponding to red generated in the inorganic photoelectric conversion section 11R, respectively, to, for example, a vertical signal line Lsig (FIG. 20 described later). Gate electrodes TG1, TG2, and TG3 of the respective transfer transistors Tr1, Tr2, and Tr3 may be included in, for example, the multilayered wiring layer 51. The signal charge may be either an electron or a hole generated by photoelectric conversion, but a case in which an electron is read out as the signal charge (a case in which an n-type semiconductor region is a photoelectric conversion layer) will be described below as an example.

In proximity to the surface S2 of the semiconductor substrate 11, a reset transistor, an amplifying transistor, a select transistor, and the like, for example, may be provided together with the transfer transistors Tr1, Tr2, and Tr3. These transistors may each be, for example, a MOSEFT (Metal Oxide Semiconductor Field Effect Transistor), and may form a circuit for each of the photoelectric conversion sections (the organic photoelectric conversion section 16, as well as the inorganic photoelectric conversion sections 11B and 11R). Each of these circuits may have, for example, a three-transistor configuration including the transfer transistor, the reset transistor, and the amplifying transistor, or may have a four-transistor configuration in which the select transistor is provided in addition to these three transistors. The transistors except the transfer transistor may be shared among the photoelectric conversion sections or pixels.

The semiconductor substrate 11 may be configured of, for example, an n-type silicon (Si) layer, and a green storage layer 110G is provided together with the above-described inorganic photoelectric conversion sections 11B and 11R in the semiconductor substrate 11.

Figure 2A:
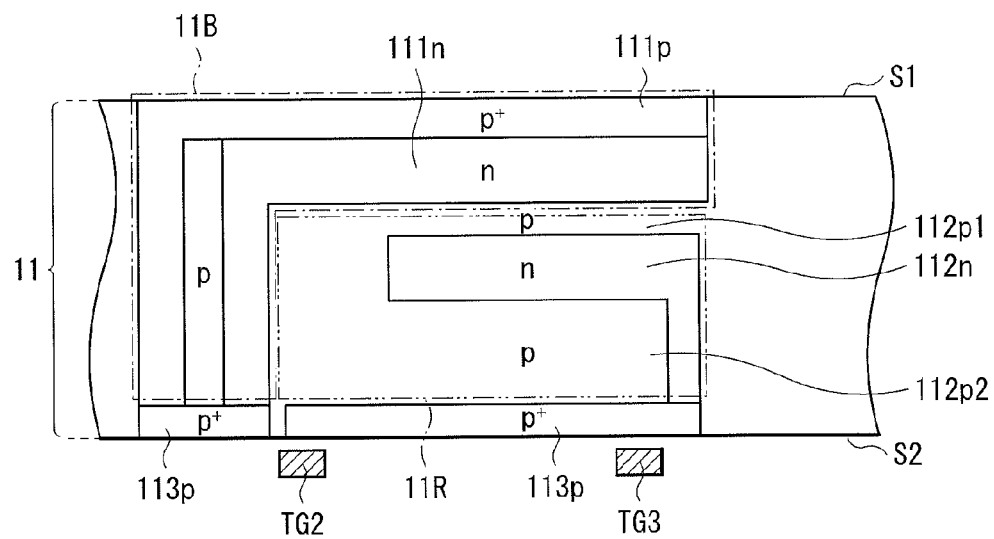
FIG. 2A is a cross-sectional diagram illustrating a configuration example of an inorganic photoelectric conversion section illustrated in FIG. 1.
Figure 2B:
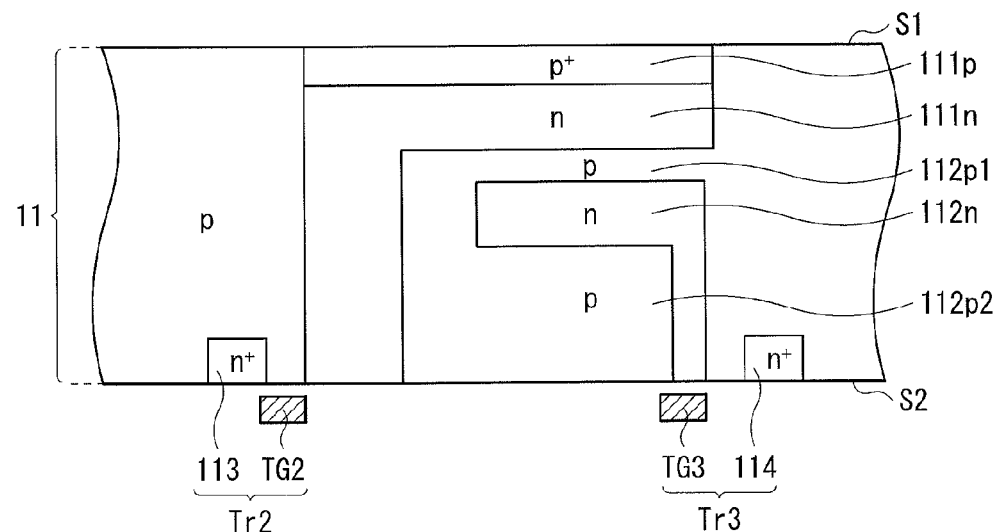
FIG. 2B is a diagram illustrating a cross section different from that of the inorganic photoelectric conversion section illustrated in FIG. 2A.

Each of the inorganic photoelectric conversion sections 11B and 11R is a photodiode having a pn junction. For example, the inorganic photoelectric conversion section 11B and the inorganic photoelectric conversion section 11R may be provided in this order from the surface 51 side of the semiconductor substrate 11. The inorganic photoelectric conversion section 11B includes a p-type semiconductor region (hereinafter simply referred to as "p-type region") 111p to become a hole storage layer, and an n-type photoelectric conversion layer (hereinafter simply referred to as "n-type region") 111n to become an electron storage layer, as illustrated in, for example, FIG. 2A. In FIG. 2A, "+(plus)" provided as a superscript to each of "p" and "n" indicates that a p-type or n-type impurity concentration is high. The p-type region 111p and the n-type photoelectric conversion layer 111n are provided in respective predetermined regions in proximity to the surface S1 of the semiconductor substrate 11, along a horizontal direction parallel to the surface S1. At least a part of each of the p-type region 111p and the n-type photoelectric conversion layer 111n extends in a direction perpendicular to the surface S1 by being bent. A floating diffusion (FD) 113 of the transfer transistor Tr2 for blue is provided in proximity to the surface S2 of the semiconductor substrate 11 (FIG. 2B), and the n-type photoelectric conversion layer 111n is connected to the FD 113 of an n-type region. A p-type region 113p (a hole storage layer) is provided between the surface S2 of the semiconductor substrate 11 and the p-type region 111p as well as the n-type photoelectric conversion layer 111n. The p-type region 111p is connected to the p-type semiconductor well region (not illustrated) in proximity to the surface S1 of the semiconductor substrate 11.

The inorganic photoelectric conversion section 11R may have, for example, a p-n-p laminated structure in a thickness direction (a direction perpendicular to the surfaces S1 and S2) of the semiconductor substrate 11. An n-type photoelectric conversion layer 112n (an electron storage layer) is provided between a p-type region 112p1 (a hole storage layer) and a p-type region 112p2. At least a part of the n-type photoelectric conversion layer 112n extends in a direction perpendicular to the surface S1 of the semiconductor substrate 11 by being bent. A floating diffusion (FD) 114 of the transfer transistor Tr3 for red is provided in proximity to the surface S2 of the semiconductor substrate 11, and the n-type photoelectric conversion layer 112n is connected to the FD 114 of an n-type region.

Figure 3:
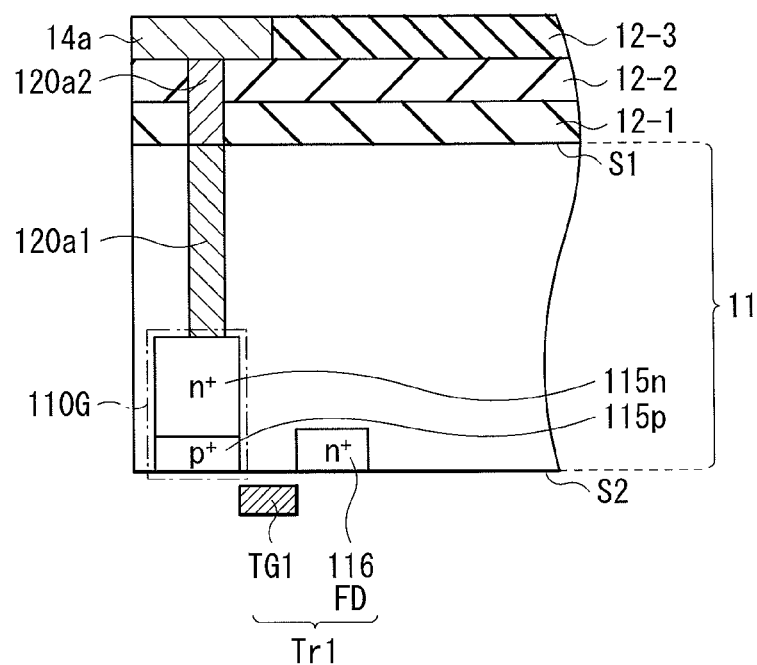
FIG. 3 is a cross-sectional diagram used to describe a configuration of a green storage layer illustrated in FIG. 1.

As illustrated in FIG. 3, the green storage layer 110G includes an n-type region 115n to become an electron storage layer, and the n-type region 115n is connected to a conductive plug 120a1. The conductive plug 120a1 is embedded in the semiconductor substrate 11, and functions as a transmission path of a signal charge (an electron) between the organic photoelectric conversion section 16 and the green storage layer 110G. In other words, an electron transmitted from the lower electrode 14a through the conductive plug 120a1 is stored in the green storage layer 110G. A floating diffusion (FD) 116 of the transfer transistor Tr1 for green is provided in proximity to the surface S2 of the semiconductor substrate 11, and the n-type region 115n is connected to the FD 116. Between the n-type region 115n and the surface S2 of the semiconductor substrate 11, a p-type region 115p (a hole storage layer) is provided.

A conductive plug 120b1 (FIG. 1) functions as a transmission path of a hole generated in the organic photoelectric conversion section 16, and the hole is discharged from the upper electrode 17 through the conductive plug 120b1. The conductive plug 120b1 is embedded in the semiconductor substrate 11 together with the conductive plug 120a1. The conductive plugs 120a1 and 120b1 may be each configured of, for example, a conductive semiconductor layer, and formed to be embedded in the semiconductor substrate 11. The conductive plug 120a1 becomes the transmission path of an electron and thus may be preferably configured of an n-type semiconductor. The conductive plug 120b1 becomes the transmission path of a hole and thus may be preferably configured of a p-type semiconductor. Alternatively, the conductive plugs 120a1 and 120b1 may be configured by, for example, embedding a conductive material such as tungsten in a through-via. In the conductive plugs 120a1 and 120b1 as described above, preferably, a side face of the via may be covered by an insulating film made of silicon oxide (SiO2), silicon nitride (SiN), or the like, to suppress a short with silicon.

The multilayered wiring layer 51 is provided in contact with the surface S2 of the semiconductor substrate 11. The multi-layer wiring layer 51 includes a plurality of wirings 51a, with an interlayer insulating film 52 provided therebetween. The multilayered wiring layer 51 may be adhered, for example, to a supporting substrate 53 made of silicon. The multilayered wiring layer 51 is disposed between the supporting substrate 53 and the semiconductor substrate 11.

An interlayer insulating layer 12 is provided on the surface S1 side of the semiconductor substrate 11. The interlayer insulating layer 12 may include, for example, an interlayer insulating layer 12-1 (a second insulating layer), an interlayer insulating layer 12-2, an interlayer insulating layer 12-3, and an interlayer insulating layer 12-4 in this order from the surface S1 side. The interlayer insulating layer 12-2 and the interlayer insulating layer 12-3 may be integrated (a single layer). The interlayer insulating layer 12-1 is provided in contact with the surface S1 of the semiconductor substrate 11, to reduce an interface state of the semiconductor substrate 11 (a silicon layer 110) and to suppress generation of a dark current from the interface with the silicon layer 110. Preferably, an insulating material having a low interface state may be used for the interlayer insulating layer 12-1 described above, and may be configured of, for example, a hafnium oxide film ($HfO_2$). For example, the interlayer insulating layer 12-2 may have a thickness of about 1,000 nm or less, and be provided between the interlayer insulating layer 12-1 and the lower electrode 14a. The lower electrode 14a and the green storage layer 110G electrically connect with each other, through a conductive plug 120a2 and the conductive plug 120a1. The conductive plug 120a2 passes through the interlayer insulating layers 12-1 and 12-2, and the conductive plug 120a1 is embedded in the semiconductor substrate 11 as described above. The interlayer insulating layer 12-3 is provided to electrically separate the plurality of patterned lower electrodes 14a, and may have, for example, a thickness of about 10 nm to about 300 nm both inclusive. In the present embodiment, a depression or concave section 12C is provided in the interlayer insulating layer 12-4 (a first insulating layer) on the interlayer insulating layer 12-3, and the organic photoelectric conversion section 16 is formed to fill the depression section 12C. As will be described later in detail, this makes it possible to enhance photoelectric conversion efficiency by increasing an optical path length of the organic photoelectric conversion section 16. The interlayer insulating layer 12-4 may have, for example, a thickness of about 3,000 nm or less.

Figure 4:
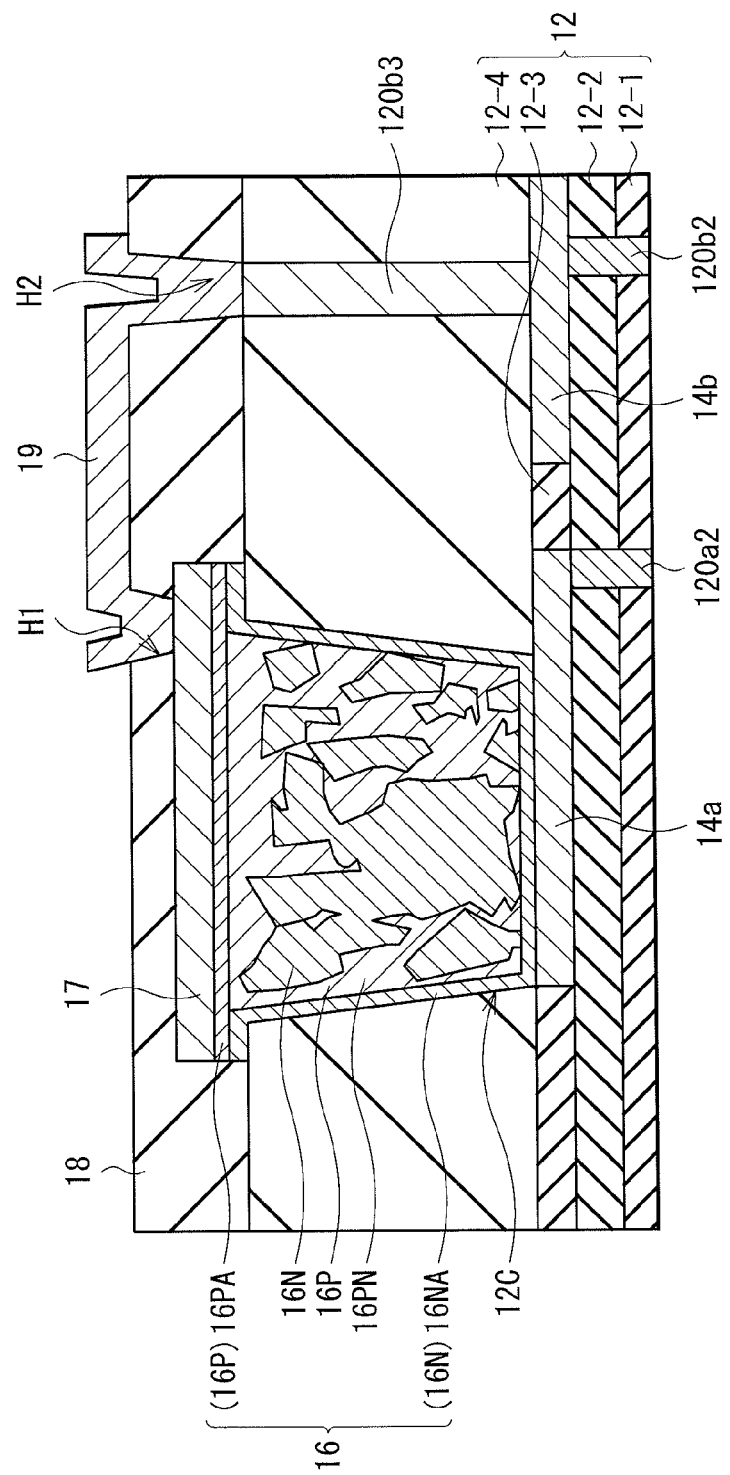
FIG. 4 is a cross-sectional diagram illustrating details of an organic photoelectric conversion section illustrated in FIG. 1.
Figure 5:
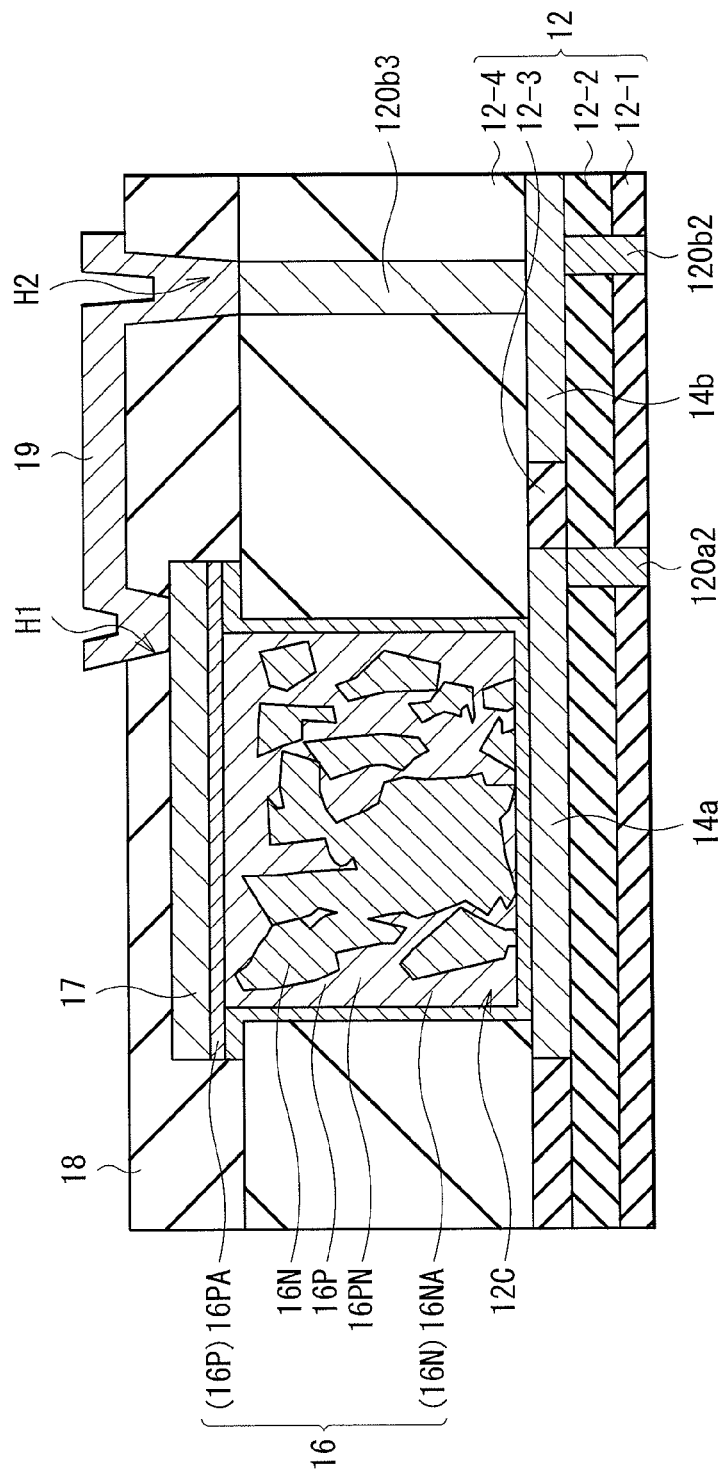
FIG. 5 is a cross-sectional diagram illustrating another example of a depression section illustrated in FIG. 4.

The depression section 12C may pass through the interlayer insulating layer 12-4 and reach the lower electrode 14a, as illustrated in FIG. 4, for example. Preferably, a cross-section of the depression section 12C may have a tapered shape, namely, a shape in which a diameter is gradually reduced from the upper electrode 17 to the lower electrode 14a. This is because the depression section 12C having such a tapered shape is able to condense light with a high degree of efficiency. Alternatively, the diameter of the depression section 12C may be fixed from the upper electrode 17 to the lower electrode 14a (FIG. 5).

Each of the interlayer insulating layers 12-2, 12-3, and 12-4 may be configured of, for example, a single layer film made of one of silicon oxide, silicon nitride, and silicon oxynitride (SION), or a laminated film made of two or more of these. The interlayer insulating layers 12-2, 12-3, and 12-4 may be, for example, silicon oxide films having respective thicknesses of about 200 nm, about 50 nm, and about 500 nm. In this case, the depression section 12C passing through the interlayer insulating layer 12-4 has a depth of about 500 nm.

The organic photoelectric conversion section 16 is provided to fill the depression section 12C of the interlayer insulating layer 12-4. The position of the surface (a surface on the upper electrode 17 side) of the organic photoelectric conversion section 16 and the position of the surface of the interlayer insulating layer 12-4 except the depression section 12C are substantially the same. To the extent of not impairing effects of the embodiment of the present technology, the position of the surface of the organic photoelectric conversion section 16 and the position of the surface of the interlayer insulating layer 12-4 may be out of alignment with each other. Alternatively, the surface of the organic photoelectric conversion section 16 may be on the semiconductor substrate 11 side or on an on-chip lens 22 side.

The organic photoelectric conversion section 16 is configured of an organic semiconductor material, and generates an electron-hole pair by absorbing light in a selective wavelength region (here, green light). The signal charge (the electron) generated in the organic photoelectric conversion section 16 is extracted by the lower electrode 14a, and the hole is discharged through the upper electrode 17.

The organic photoelectric conversion section 16 may preferably include both an n-type semiconductor 16N and a p-type semiconductor 16P (FIG. 1).

Since both the n-type semiconductor 16N and the p-type semiconductor 16P are included, a pn-junction plane is produced, and a so-called pin bulk heterostructure is formed. Therefore, the pn-junction plane increases in the depression section 12C, making it possible to enhance photoelectric conversion efficiency further.

Figure 6:
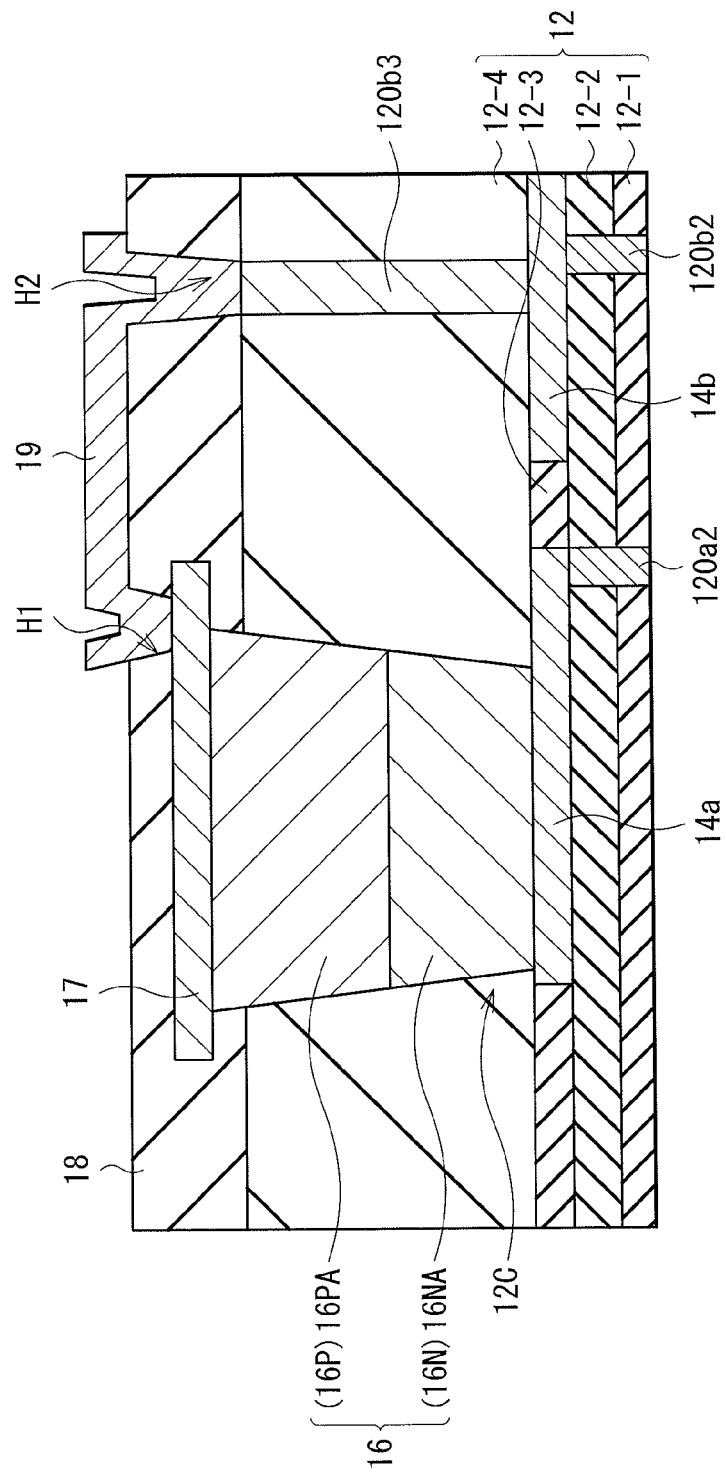
FIG. 6 is a cross-sectional diagram illustrating another example of the organic photoelectric conversion section illustrated in FIG. 4.
Figure 7:
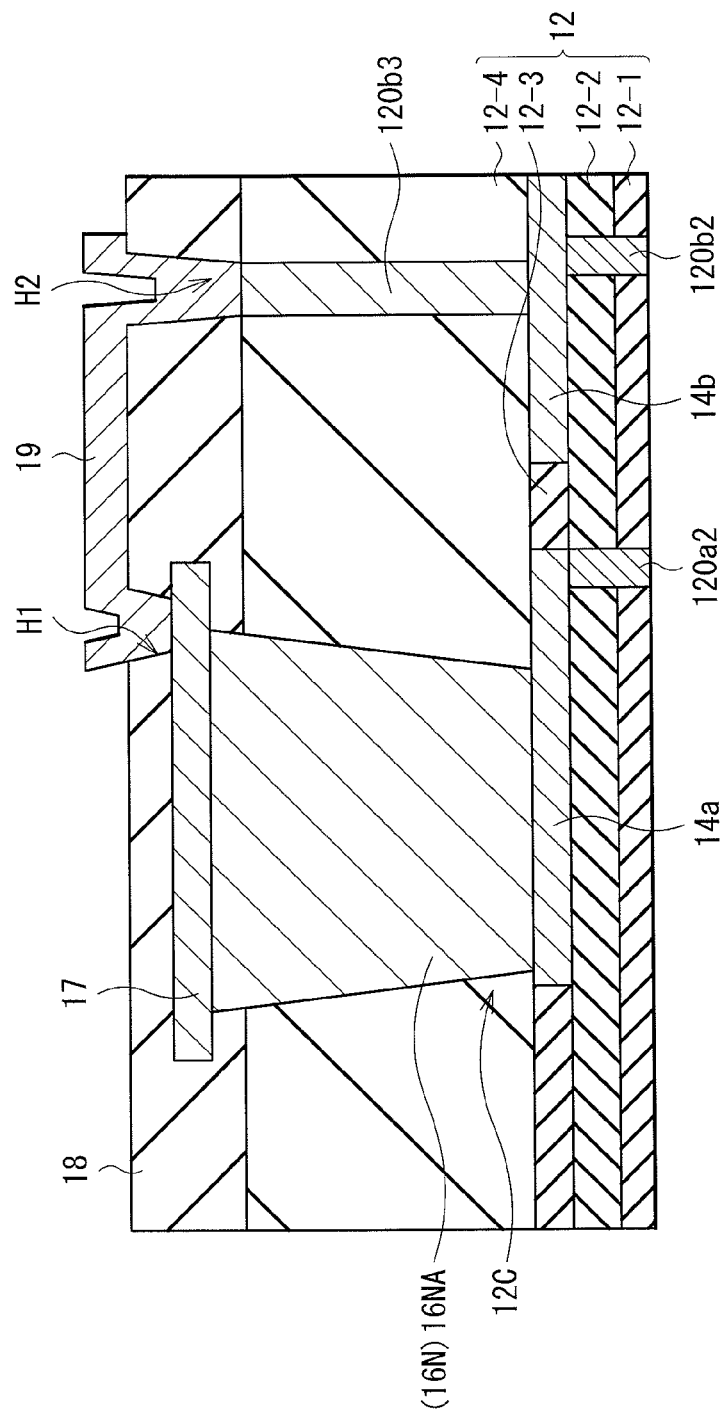
FIG. 7 is a cross-sectional diagram illustrating still another example of the organic photoelectric conversion section illustrated in FIG. 4.

Preferably, the organic photoelectric conversion section 16 may include, in addition to such a mixed layer (a co-deposited layer 16PN) of the n-type semiconductor 16N and the p-type semiconductor 16P, an n-type semiconductor layer 16NA made of the n-type semiconductor 16N and a p-type semiconductor layer 16PA made of the p-type semiconductor 16P (FIG. 4). The n-type semiconductor layer 16NA is provided along a sidewall and a bottom of the depression section 12C, and contacts the lower electrode 14a. The p-type semiconductor layer 16PA is in contact with the upper electrode 17, and covers one surface of the upper electrode 17. For example, the co-deposited layer 16PN may be provided between the p-type semiconductor layer 16PA and the n-type semiconductor layer 16NA. Of an electron-hole pair generated in the co-deposited layer 16PN, the electron moves to the lower electrode 14a through the n-type semiconductor layer 16NA, and the hole moves to the upper electrode 17 through the p-type semiconductor layer 16PA. As illustrated in FIG. 6, the organic photoelectric conversion section 16 may be configured by laminating the n-type semiconductor layer 16NA and the p-type semiconductor layer 16PA. Alternatively, the organic photoelectric conversion section 16 may be configured by using only either one of the n-type semiconductor layer 16NA and the p-type semiconductor layer 16PA, as illustrated in FIG. 7. Preferably, a p-type blocking layer (not illustrated) and an n-type blocking layer (not illustrated) may be provided between the lower electrode 14a and the n-type semiconductor layer 16NA, and between the upper electrode 17 and the p-type semiconductor layer 16PA, respectively. The p-type blocking layer and the n-type blocking layer are provided to suppress occurrence of a dark current by injection of a hole from the lower electrode 14a and occurrence of a dark current by injection of an electron from the upper electrode 17, respectively. Films such as an undercoating film, a buffer film, and a work-function adjustment film (none of these is illustrated) may be provided in the organic photoelectric conversion section 16. The undercoating film is provided to smooth irregularities of the lower electrode 14a. The buffer film is provided to suppress deterioration in forming the upper electrode 17. The work-function adjustment film is provided to suppress occurrence of a dark current, by adjusting a work function of the upper electrode 17.

The organic photoelectric conversion section 16 as described above faces the inorganic photoelectric conversion sections 11B and 11R, with the interlayer insulating layers 12-1 and 12-2 as well as the lower electrode 14a interposed therebetween. In other words, the organic photoelectric conversion section 16 is disposed to overlap the inorganic photoelectric conversion sections 11B and 11R in a planar view. Light enters the inorganic photoelectric conversion sections 11B and 11R after passing through the organic photoelectric conversion section 16 and the lower electrode 14a. Therefore, preferably, the organic photoelectric conversion section 16 (the depression section 12C) may have a structure capable of condensing the light on the inorganic photoelectric conversion sections 11B and 11R, namely, a waveguiding structure. Specifically, a refractive index of the material (the n-type semiconductor 16N and the p-type semiconductor 16P) of the organic photoelectric conversion section 16 and a refractive index of the lower electrode 14a may preferably be higher than a refractive index of a periphery (the interlayer insulating layer 12-4) of the organic photoelectric conversion section 16. Thus, the light that has passed through the organic photoelectric conversion section 16 and the lower electrode 14a is condensed and enters the inorganic photoelectric conversion sections 11B and 11R. For example, the refractive index of the organic photoelectric conversion section 16 may be about 1.7 to about 2.0 both inclusive, the refractive index of the lower electrode 14a made of ITO may be about 1.8, and the refractive index of the interlayer insulating layer 12-4 made of the silicon oxide film may be about 1.4.

The organic photoelectric conversion section 16 photoelectrically converts light in a specific wavelength region (green light), and allows light in other wavelength regions to pass therethrough. Preferably, the material of the organic photoelectric conversion section 16 may have transmittance of 70% or more with respect to the light in the other wavelength regions.

Preferably, as the materials of the n-type semiconductor 16N and the p-type semiconductor 16P, for example, any of quinacridone derivatives, naphthalene derivatives, anthracene derivatives, phenanthrene derivatives, tetracene derivatives, pyrene derivatives, perylene derivatives, and fluoranthene derivatives may be used. Examples of the materials of the n-type semiconductor 16N and the p-type semiconductor 16P may also include polymers, derivatives, and the like of phenylene vinylene, fluorene, carbazole, indole, pyrene, pyrrole, picoline, thiophene, acetylene, diacetylene, and the like. Any of metal complex dyes, cyanine-based dyes, merocyanine-based dyes, phenylxanthene-based dyes, triphenylmethane-based dyes, rhodacyanine-based dyes, xanthene-based dyes, macrocyclic azaannulene-based dyes, azulene-based dyes, and naphthoquinone-based or anthraquinone-based dyes may also be used. Preferable examples of the metal complex dyes may include dithiol-metal-complex-based dyes, metallophthalocyanine dyes, metalloporphyrin dyes, and ruthenium complex dyes. Above all, the ruthenium complex dyes, in particular, may be preferable. The n-type semiconductor 16N and the p-type semiconductor 16P may be configured of a chain compound obtained by condensation of a polycyclic aromatic such as anthracene and pyrene, or an aromatic ring, or a heterocyclic compound.

Other usable examples may include: a compound in which two or more nitrogen-containing heterocyclic rings such as quinoline, benzothiazole, and benzoxazole are bonded using a squarylium group and/or a croconic methine group as a joining chain; and a cyanine analogue dye bonded by a squarylium group and/or a croconic methine group.

The lower electrode 14a and the upper electrode 17 face each other with the organic photoelectric conversion section 16 provided therebetween, in a depth direction of the depression section 12C. The lower electrode 14a extracts a signal charge (a hole) generated in the organic photoelectric conversion section 16, and is electrically connected to the green storage layer 110G through the conductive plugs 120a1 and 120a2. As described above, the lower electrode 14a is provided to face the light-receiving surface of each of the inorganic photoelectric conversion sections 11B and 11R. In other words, the lower electrode 14a is provided right above the inorganic photoelectric conversion sections 11B and 11R. Therefore, the lower electrode 14a may be configured of an optically-transparent conductive material, e.g. ITO (Indium-Tin-Oxide). The lower electrode 14a may also be configured of, for example, a material based on tin oxide (SnO2) or a material based on zinc oxide (ZnO). The material based on tin oxide is obtained by adding a dopant to tin oxide. Examples of the material based on zinc oxide may include aluminum zinc oxide (AZO) in which aluminum (Al) is added as a dopant to zinc oxide, gallium zinc oxide (GZO) in which gallium (Ga) is added as a dopant to zinc oxide, and indium zinc oxide (IZO) in which indium (In) is added as a dopant to zinc oxide. Further, any of IGZO, CuI, InSbO$_4$, ZnMgO, CuInO$_2$, MgIn$_2$O$_4$, CdO, ZnSnO$_3$, and the like may be used. The lower electrode 14a has a thickness equal to the thickness of the interlayer insulating layer 12-3, and may be, for example, about 10 nm to about 300 nm both inclusive.

A contact metal layer 19, a conductive plug 120b3, a wiring 14b, a conductive plug 120b2, and the conductive plug 120b1 are electrically connected to the upper electrode 17. The conductive plug 120b3 passes through the interlayer insulating layer 12-4, and the conductive plug 120b2 passes through the interlayer insulating layers 12-1 and 12-2. A hole generated in the organic photoelectric conversion section 16 is discharged through this transmission path. The wiring 14b may be provided, for example, on the interlayer insulating layer 12-2, and separated by the lower electrode 14a and the interlayer insulating layer 12-3. Preferably, the conductive plug 120b2, the wiring 14b, and the conductive plug 120b3 may be electrically connected between the upper electrode 17 and the conductive plug 120b1 (the semiconductor substrate 11), and function as a light-shielding section. The conductive plug 120b2, the wiring 14b, and the conductive plug 120b3 may be configured of a laminated film made of a conductive material having a light-shielding function, e.g. a metallic material such as titanium (Ti), titanium nitride (TiN), and tungsten (W). A material similar to that of the conductive plug 120b2 may be also used for the conductive plug 120a2.

The upper electrode 17 is configured of an optically-transparent conductive material, as with the lower electrode 14a. In the image pickup device 10, a hole extracted from the upper electrode 17 is discharged. Therefore, when a plurality of image pickup devices 10 are arranged (for example, the image pickup unit 1 in FIG. 20 described later), the upper electrode 17 may be provided as an electrode common to the image pickup devices 10 (the pixel P in FIG. 20). The upper electrode 17 may have a thickness of, for example, about 10 nm to about 200 nm both inclusive.

A protective film 18 is provided on the interlayer insulating layer 12 (the interlayer insulating layer 12-4), and covers the upper electrode 17. The protective film 18 is provided with connection holes H1 and H2. The upper electrode 17 and the contact metal layer 19 are electrically connected to each other through the connection hole H1. The contact metal layer 19 and the conductive plug 120b3 are electrically connected to each other through the connection hole H2. The connection hole H1 and the connection hole H2 are provided at a position facing the upper electrode 17 and a position facing the conductive plug 120b3, respectively. The protective film 18 has optical transparency, and may be configured of, for example, a single layer film made of any of silicon nitride, silicon oxide, silicon oxynitride, and the like, or a laminated film made of any of these. The protective film 18 may have a thickness of, for example, about 100 nm to about 300 nm both inclusive.

A flattening layer 21 is provided on the entire surface of the protective film 18, and covers the contact metal layer 19. On the flattening layer 21, the on-chip lens 22 is provided. Light entering from above is condensed on the light-receiving surface of each of the organic photoelectric conversion section 16, the inorganic photoelectric conversion section 11B, and the inorganic photoelectric conversion section 11R, by the on-chip lens 22. In the image pickup device 10 of the backside-illumination type, the distance between the on-chip lens 22 and the light-receiving surface of each of the inorganic photoelectric conversion sections 11B and 11R is short. Therefore, it is possible to suppress unevenness of sensitivity of each color, which occurs depending on the F-number of the on-chip lens 22.

(Method of Manufacturing Image Pickup Device 10)

The image pickup device 10 as described above may be manufactured as follows, for example (FIG. 8A to FIG. 12).

Figure 8A:
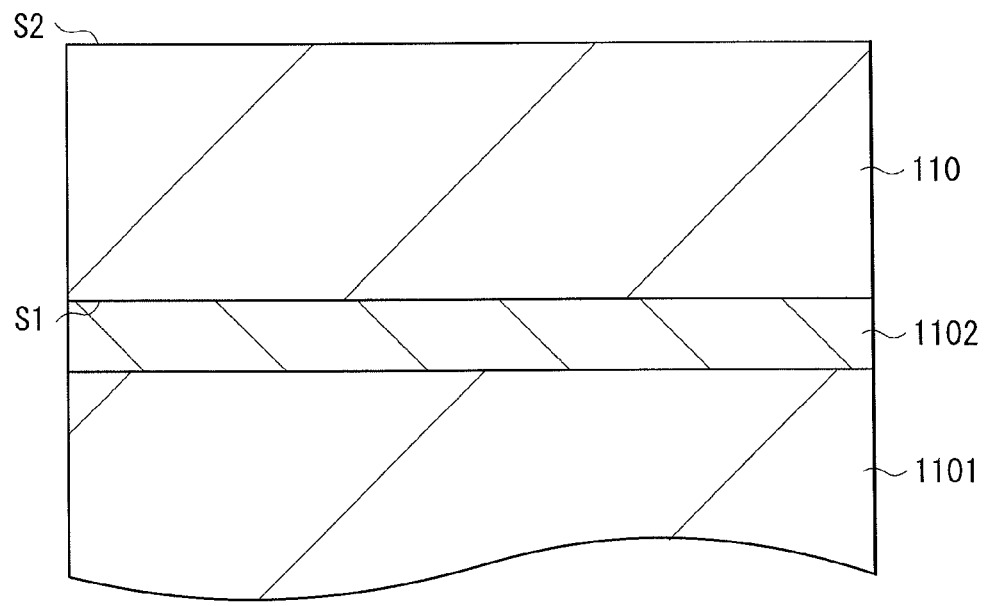
FIG. 8A is a cross-sectional diagram illustrating an example of a manufacturing process of the image pickup device illustrated in FIG. 1.
Figure 8B:
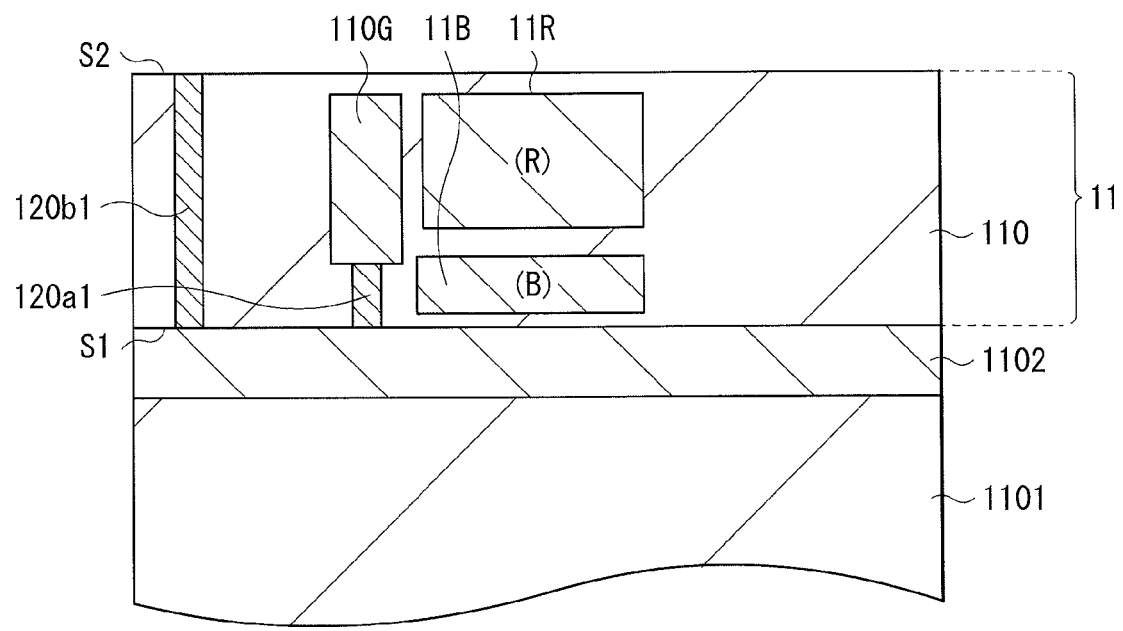
FIG. 8B is a cross-sectional diagram illustrating a process following that in FIG. 8A.

First, the semiconductor substrate 11 is formed. As illustrated in FIG. 8A, at first, a substrate (a so-called SOI substrate) having a silicon oxide film 1102 between a silicon substrate 1101 and the silicon layer 110 is prepared. The conductive plugs 120a1 and 120b1 are then formed in the silicon layer 110, to form the semiconductor substrate 11. Of the silicon layer 110, a surface in contact with the silicon oxide film 1102 is the surface S1 of the semiconductor substrate 11. The conductive plugs 120a1 and 120b1 may be formed, for example, by forming a through-via in the silicon layer 110, and filing this through-via with tungsten and an insulating film such as silicon nitride. Alternatively, a conductive impurity semiconductor layer may be formed as the conductive plugs 120a1 and 120b1, by ion implantation into the silicon layer 110. Next, the inorganic photoelectric conversion sections 11B and 11R are formed to overlap each other, in respective regions having different depths in the silicon layer 110. The green storage layer 110G is formed together with the inorganic photoelectric conversion sections 11B and 11R, by ion implantation. Transistors such as the transfer transistors Tr1, Tr2, and Tr3 as well as peripheral circuits such as a logic circuit are provided in proximity to the surface S2 of the semiconductor substrate 11. The semiconductor substrate 11 is thus formed (FIG. 8B).

Figure 9:
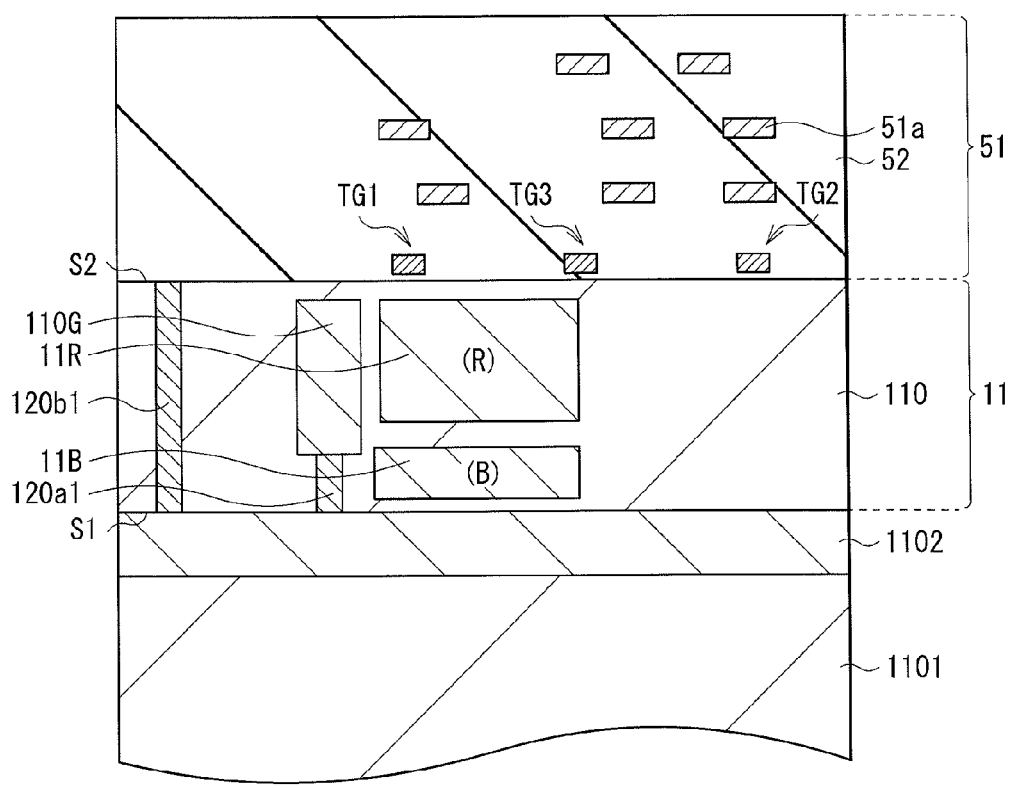
FIG. 9 is a cross-sectional diagram illustrating a process following that in FIG. 8B.
Figure 10:
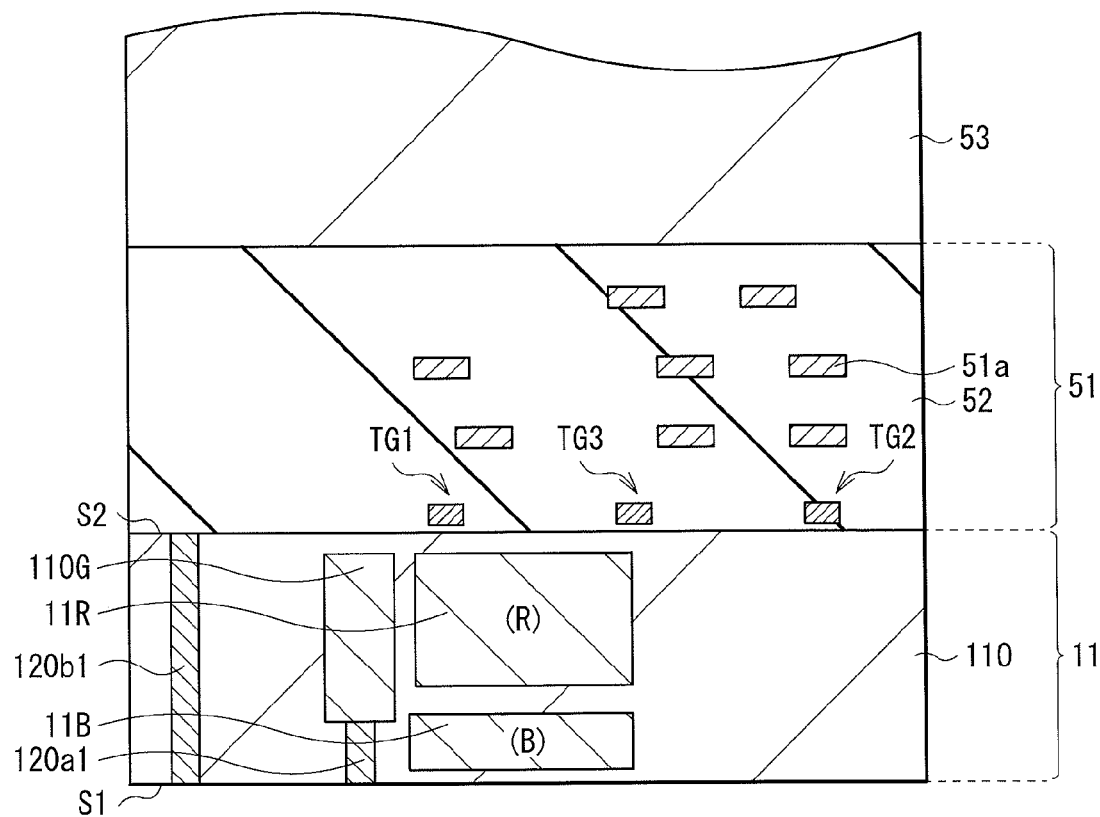
FIG. 10 is a cross-sectional diagram illustrating a process following that in FIG. 9.
Figure 11:
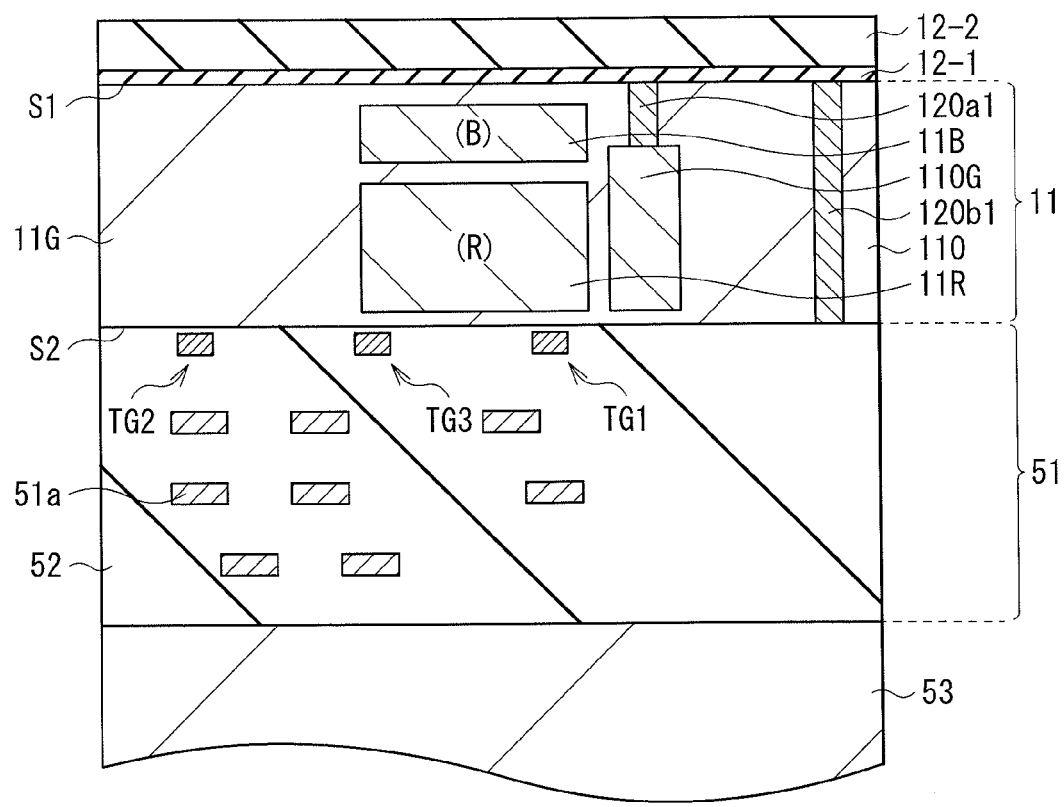
FIG. 11 is a cross-sectional diagram illustrating a process following that in FIG. 10.

Next, as illustrated in FIG. 9, the multilayered wiring layer 51 is formed on the surface S2 of the semiconductor substrate 11. In the multilayered wiring layer 51, the plurality of wirings 51a are formed with the interlayer insulating film 52 provided therebetween. Subsequently, the supporting substrate 53 is adhered to the multilayered wiring layer 51, which is followed by removal of the silicon oxide film 1102 and the silicon substrate 1101 from the silicon layer 110 to expose the surface S1 of the silicon layer 110 (FIG. 10). Afterwards, a hafnium oxide film may be formed by, for example, ALD (Atomic Layer Deposition) and a silicon oxide film may be formed by, for example, plasma CVD (Chemical Vapor Deposition) in this order on the surface S1 of the semiconductor substrate 11, so that the interlayer insulating layers 12-1 and 12-2 are formed as illustrated in FIG. 11.

Next, in the interlayer insulating layers 12-1 and 12-2, connection holes are provided at respective positions facing the conductive plugs 120a1 and 120b1. The connection holes are then each filled with a conductive material by forming a conductive film on the interlayer insulating layer 12-2. The conductive plugs 120a2 and 120b2 are thus formed. The conductive film on the interlayer insulating layer 12-2 is patterned to have a desired shape, so that the wiring 14b is formed together with the conductive plugs 120a2 and 120b2.

After the conductive plugs 120a2 and 120b2 as well as the wiring 14b are formed, the lower electrode 14a is formed on the interlayer insulating layer 12-2. The lower electrode 14a may be formed by depositing an ITO film having a thickness of about 50 nm by, for example, sputtering, and then by patterning this ITO film through use of a photolithography technique, which is followed by dry etching or wet etching. The lower electrode 14a may be provided before the wiring 14b is formed.

After the lower electrode 14a and the wiring 14b are formed, the interlayer insulating layers 12-3 and 12-4 may be each formed on the lower electrode 14a, the wiring 14b, and the interlayer insulating layer 12-2, by depositing a silicon oxide film through, for example, plasma CVD. The interlayer insulating layers 12-3 and 12-4 may be planarized beforehand by, for example, CMP (Chemical Mechanical Polishing) or the like. Next, the conductive plug 120b3 is formed at a position in the interlayer insulating layer 12-4, the position facing the wiring 14b. The conductive plug 120b3 may be formed by, for example, providing a connection hole in the interlayer insulating layer 12-4, and depositing titanium nitride and tungsten in this order within this connection hole. Titanium nitride and tungsten remaining on the interlayer insulating layer 12-4 may be eliminated by, for example, CMP.

Figure 12:
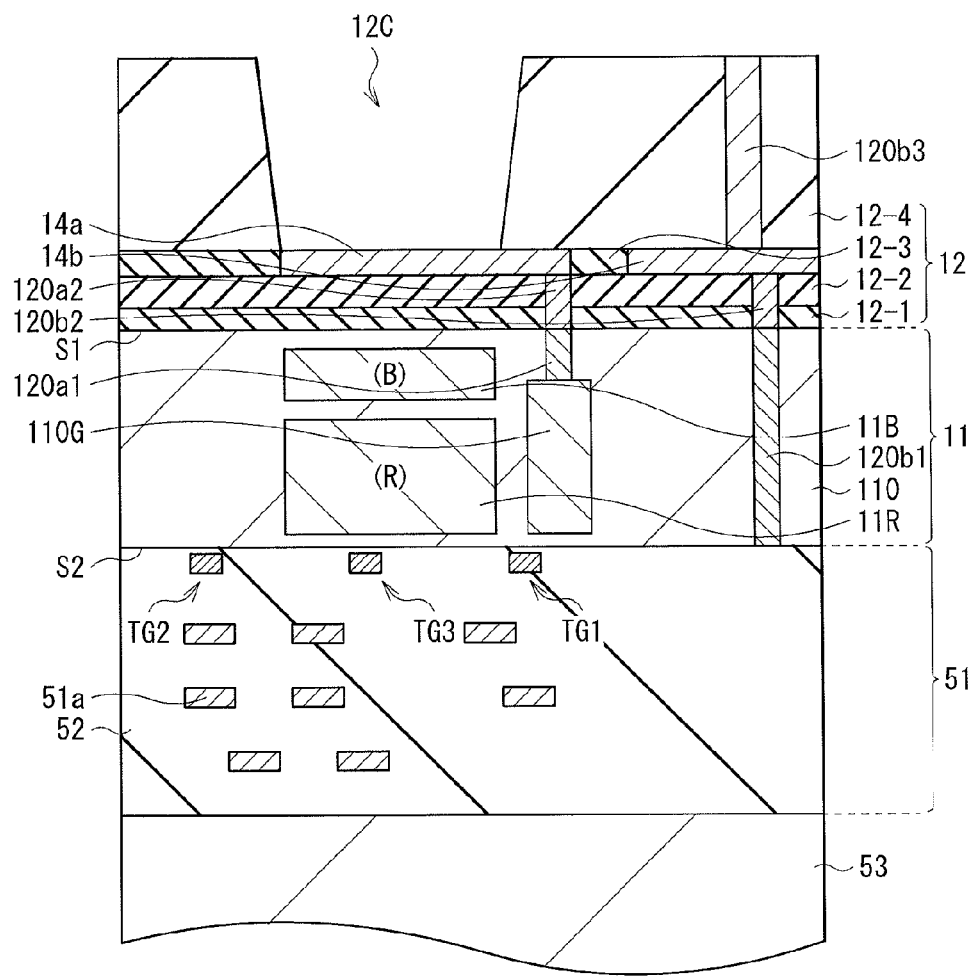
FIG. 12 is a cross-sectional diagram illustrating a process following that in FIG. 11.

Next, as illustrated in FIG. 12, the depression section 12C is formed in the interlayer insulating layer 12-4, to reach the lower electrode 14a. The depression section 12C may be formed by, for example, dry etching, argon (Ar) sputtering, or the like. Subsequently, the organic photoelectric conversion section 16 may be formed by forming a film of a quinacridone derivative in the depression section 12C by, for example, vacuum deposition. The organic photoelectric conversion section 16 may be formed, for example, by providing the n-type semiconductor layer 16NA, the co-deposited layer 16PN, and the p-type semiconductor layer 16PA in this order. The organic photoelectric conversion section 16 may be formed by coating.

After the organic photoelectric conversion section 16 is formed, the upper electrode 17 may be formed by depositing ITO on the organic photoelectric conversion section 16 through use of, for example, vacuum deposition. Properties of the organic photoelectric conversion section 16 may be fluctuated under influence of water, oxygen, hydrogen, and the like. Therefore, preferably, the upper electrode 17 may be formed in a vacuum state, sequentially from the organic photoelectric conversion section 16. The upper electrode 17 may be formed by sputtering or the like. After the upper electrode 17 is formed, the protective film 18 is formed on the upper electrode 17 and the interlayer insulating layer 12-4. The protective film 18 is formed as follows. Silicon nitride or silicon oxide may be deposited by, for example, plasma CVD and then, patterning by a photolithography technique and dry etching are performed. Lastly, deposits and residues are removed by applying an after treatment such as ashing and organic washing.

After the protective film 18 is formed, the connection hole H1 and the connection hole H2 are formed in the protective film 18, at the position facing the upper electrode 17, and the position facing the conductive plug 120b3, respectively. Next, the contact metal layer 19 is formed on the protective film 18, to fill the connection holes H1 and H2. Subsequently, the flattening layer 21 is formed on the contact metal layer 19 and the protective film 18 and then, the on-chip lens 22 is formed on the flattening layer 21. The image pickup device 10 illustrated in FIG. 1 is completed by going through the above-described process.

(Operation of Image Pickup Device 10)

Figure 13:
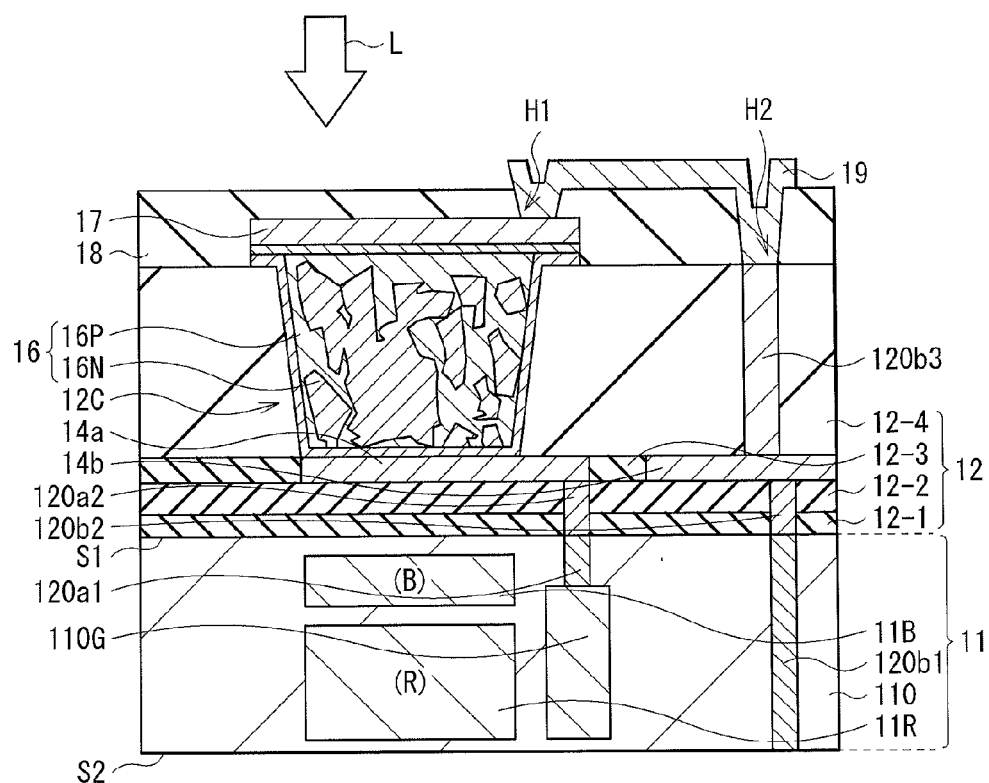
FIG. 13 is a cross-sectional diagram used to describe operation of the image pickup device illustrated in FIG. 1.
Figure 14:
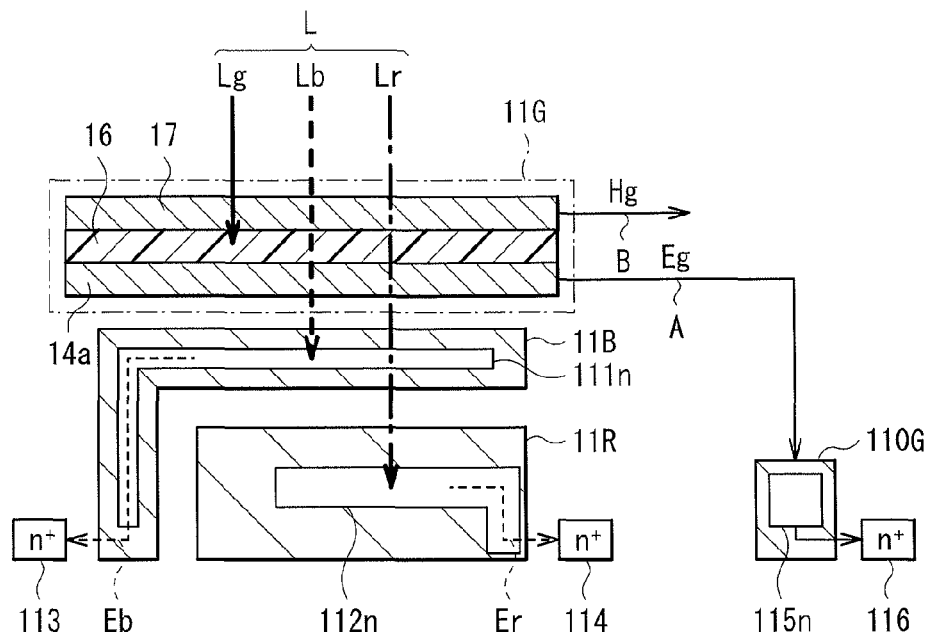
FIG. 14 is a schematic diagram used to describe operation of the image pickup device illustrated in FIG. 1.

In the image pickup device 10 as described above, a signal charge (an electron) may be obtained as follows, for example, as a pixel of an image pickup unit. When light L (FIG. 13) enters the image pickup device 10 through the on-chip lens 22 (FIG. 1), the light L passes through the organic photoelectric conversion section 16, the inorganic photoelectric conversion section 11B, and the inorganic photoelectric conversion section 11R in this order. The light L is photoelectrically converted for each of green light, blue light, and red light, while passing through these sections. Specifically, as illustrated in FIG. 14, of the light L entering the image pickup device 10, at first, green light Lg is selectively detected (absorbed) and photoelectrically converted in the organic photoelectric conversion section 16. An electron Eg of an electron-hole pair generated in the organic photoelectric conversion section 16 is extracted by the lower electrode 14a and stored in the green storage layer 110G through a transmission path A (the conductive plugs 120a1 and 120a2). The stored electron Eg is transferred to the FD 116, in reading operation. On the other hand, a hole Hg is discharged from the upper electrode 17 through a transmission path B (the conductive plugs 120b1, 120b2, and 120b3, as well as the wiring 14b).

In the image pickup device 10, a predetermined negative potential VL (<0V) and a potential VU (<VL) lower than the potential VL are applied to the lower electrode 14a and the upper electrode 17, respectively. Therefore, in a charge storage state (a state in which the reset transistor (not illustrated) and the transfer transistor Tr1 are off), an electron of an electron-hole pair generated in the organic photoelectric conversion section 16 is guided to the lower electrode 14a having a relatively high potential. The electron Eg is extracted from the lower electrode 14a, and stored in the green storage layer 110G (specifically, in the n-type region 115n) through the transmission path A. When the electron Eg is stored, the potential VL of the lower electrode 14a electrically connecting with the green storage layer 110G changes. This change of the potential VL is equivalent to the signal potential (here, the electric potential of a green signal). It is to be noted that the potential VL may be applied, for example, from the wiring 51a of the multilayered wiring layer 51 to the lower electrode 14a through the transmission path A, and the potential VU may be applied, for example, from the wiring 51a of the multilayered wiring layer 51 to the upper electrode 17 through the transmission path B.

In the reading operation, the transfer transistor Tr1 enters an ON state, and the electron Eg stored in the green storage layer 110G is transferred to the FD 116. As a result, the green signal based on the amount of the received green light Lg is read out to the vertical signal line Lsig (in FIG. 20 described later) through a pixel transistor (not illustrated), for example. Subsequently, the reset transistor (not illustrated) and the transfer transistor Tr1 each enter the ON state, and the FD 116 of the n-type region and the storage region (the n-type region 115n) of the green storage layer 110G may be reset to a power supply voltage VDD, for example.

Of the light after passing through the organic photoelectric conversion section 16, blue light and red light are absorbed and photoelectrically converted by the inorganic photoelectric conversion section 11B and the inorganic photoelectric conversion section 11R, respectively. In the inorganic photoelectric conversion section 11B, an electron Eb corresponding to the incident blue light is stored in the n-type region (the n-type photoelectric conversion layer 111n). The stored electron Eb is transferred to the FD 113 in reading operation. At this moment, a hole generated in the inorganic photoelectric conversion section 11B is stored in the p-type region (not illustrated in FIG. 14). Similar processing is performed in the inorganic photoelectric conversion section 11R. In the inorganic photoelectric conversion section 11R, an electron Er corresponding to the incident red light is stored in the n-type region (the n-type photoelectric conversion layer 112n). The stored electron Er is transferred to the FD 114 in reading operation. At this moment, a hole generated in the inorganic photoelectric conversion section 11R is stored in the p-type region (not illustrated in FIG. 14).

In the charge storage state, the negative potential VL is applied to the lower electrode 14a as described above. Therefore, hole density in the p-type region (the p-type region 111p in FIG. 2) that is the hole storage layer of the inorganic photoelectric conversion section 11B easily increases. This makes it possible to suppress occurrence of a dark current at an interface between the p-type region 111p and the interlayer insulating layer 12-1.

The reading operation in each of the inorganic photoelectric conversion sections 11B and 11R is performed in a manner similar to that in the organic photoelectric conversion section 16. The transfer transistors Tr2 and Tr3 each enter an ON state, and the electrons Eb and Er stored in the n-type photoelectric conversion layers 111n and 112n, respectively, are transferred to the FDs 113 and 114, respectively. As a result, a blue signal based on the amount of received blue light Lb and a red signal based on the amount of received red light Lr are read out to the vertical signal line Lsig (FIG. 20 described later) through a pixel transistor (not illustrated), for example. Subsequently, the reset transistor (not illustrated) as well as the transfer transistors Tr2 and Tr3 each enter the ON state, and the FDs 113 and 114 which are the n-type regions may be reset to the power supply voltage VDD, for example.

(Functions and Effects of Image Pickup Device 10)

In this way, it is possible to separate and detect the red, green, and blue light without providing a color filter, and to obtain the signal charge of each color, by vertically laminating the organic photoelectric conversion section 16 as well as the inorganic photoelectric conversion sections 11B and 11R. Therefore, an optical loss (desensitization) due to absorption of color light by the color filter, and generation of a false color accompanying pixel interpolation processing are allowed to be suppressed.

In the image pickup device 10, the interlayer insulating layer 12-4 has the depression section 12C, and the organic photoelectric conversion section 16 is provided to fill the depression section 12C. Thus, photoelectric conversion efficiency of the organic photoelectric conversion section 16 is allowed to be enhanced. This will be described below.

Figure 15:
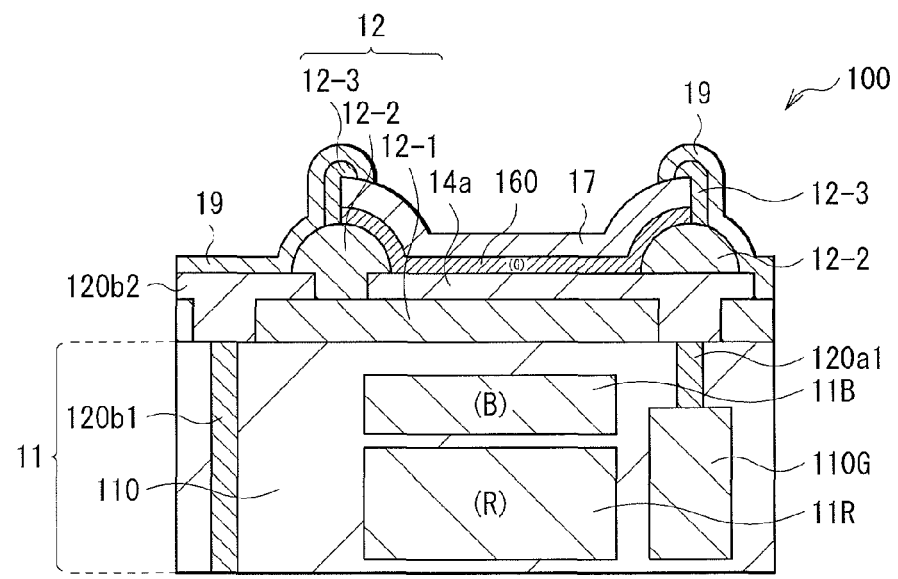
FIG. 15 is a cross-sectional diagram illustrating a configuration of an image pickup device according to a comparative example.

FIG. 15 illustrates a cross-sectional configuration of a main part of an image pickup device (an image pickup device 100) according to a comparative example. The image pickup device 100 does not include an interlayer insulating film between a lower electrode 14a and an upper electrode 17, and does not have a depression section either. In other words, an organic photoelectric conversion section 160 between the lower electrode 14a and the upper electrode 17 is shaped like a thin film, and it is difficult to increase an optical path length of the organic photoelectric conversion section 160. Therefore, sensitivity of the organic photoelectric conversion section 160 is low, and photoelectric conversion efficiency is also low.

In contrast, in the image pickup device 10, the interlayer insulating layer 12-4 is provided between the lower electrode 14a and the upper electrode 17, and the interlayer insulating layer 12-4 has the depression section 12C. The organic photoelectric conversion section 16 is formed to fill the depression section 12C. In other words, the organic photoelectric conversion section 16 is formed as deep as the depression section 12C. Thus, the thickness thereof is large as compared with that of the organic photoelectric conversion section 160 in the image pickup device 100. Therefore, the organic semiconductor material (the p-type semiconductor 16P and the n-type semiconductor 16N) per unit area increases, and the optical path length of the organic photoelectric conversion section 16 becomes longer. In particular, when the organic photoelectric conversion section 16 has the pin bulk heterostructure, the pn junction area greatly increases. Therefore, in the image pickup device 10, photoelectric conversion efficiency is higher than that in the image pickup device 100.

It is also possible to configure a waveguiding structure toward the inorganic photoelectric conversion sections 11B and 11R, by using the depression section 12C of the interlayer insulating layer 12-4. Light is efficiently guided to the inorganic photoelectric conversion sections 11B and 11R provided right under the depression section 12C (the organic photoelectric conversion section 16), by increasing the refractive index of the organic photoelectric conversion section 16 and the refractive index of the lower electrode 14a to be higher than the refractive index of the interlayer insulating layer 12-4. Collection efficiency is further improved by forming the depression section 12C into a tapered shape. In this way, in the image pickup device 10, the photoelectric conversion efficiency of the inorganic photoelectric conversion sections 11B and 11R are also allowed to be enhanced.

As described above, in the present embodiment, the organic photoelectric conversion section 16 is provided in the depression section 12C of the interlayer insulating layer 12-4 and therefore, the photoelectric conversion efficiency is allowed to be enhanced by increasing the optical path length of the organic photoelectric conversion section 16.

Modifications of the above-described embodiment will be described below. In the following description, the same elements as those of the above-described embodiment will be provided with the same reference numerals as those of the above-described embodiment, and the description thereof will be omitted as appropriate.

(Modification 1)

Figure 16:
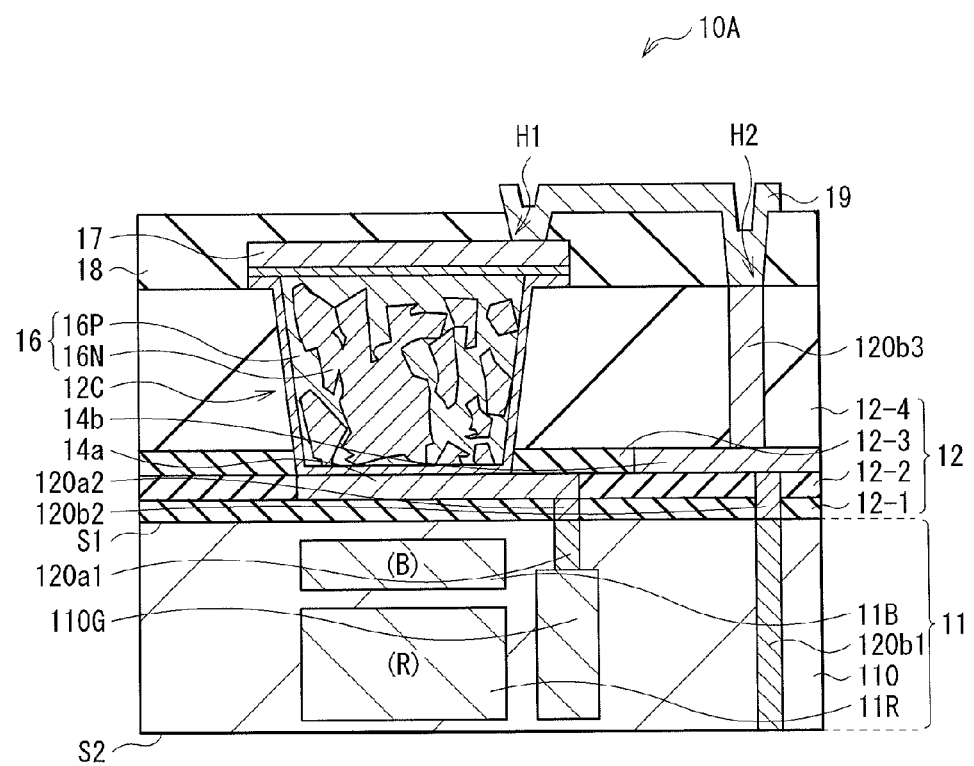
FIG. 16 is a cross-sectional diagram illustrating a configuration of an image pickup device according to a modification 1.

FIG. 16 illustrates a cross-sectional configuration of an image pickup device (an image pickup device 10A) according to a modification 1 of the above-described embodiment. In the image pickup device 10A, the interlayer insulating film (the interlayer insulating layer 12-2) is not present between the lower electrode 14a and the interlayer insulating layer 12-1. The image pickup device 10A is otherwise similar to the image pickup device 10 in terms of configuration, functions, and effects.

In the image pickup device 10A, the lower electrode 14a is in contact with the interlayer insulating layer 12-1, and the insulating film between the semiconductor substrate 11 and the organic photoelectric conversion section 16 is minimized. This makes it possible to reduce reflection when light travels from the organic photoelectric conversion section 16 to the inorganic photoelectric conversion section 11B, thereby further increasing the photoelectric conversion efficiency.

(Modification 2)

Figure 17:
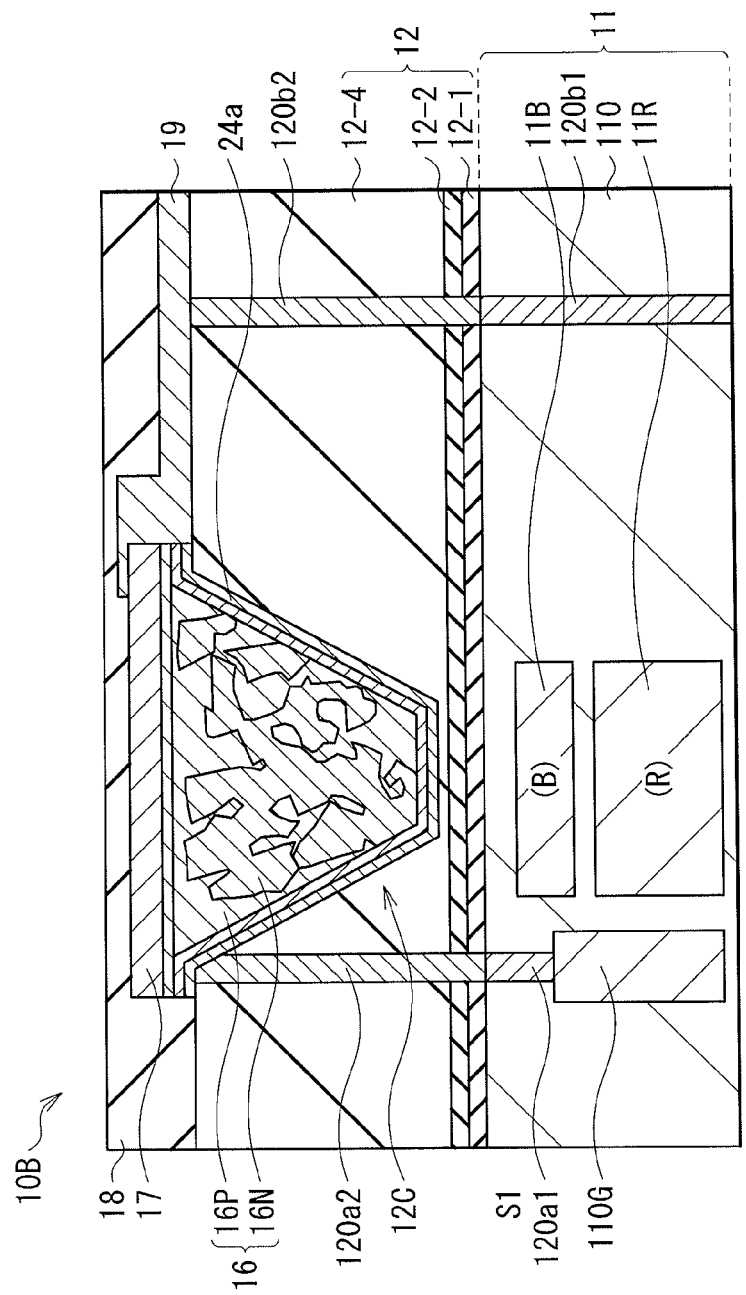
FIG. 17 is a cross-sectional diagram illustrating a configuration of an image pickup device according to a modification 2.

FIG. 17 illustrates a cross-sectional configuration of an image pickup device (an image pickup device 10B) according to a modification 2 of the above-described embodiment. In the image pickup device 10B, a lower electrode (a lower electrode 24a) is provided in in the depression section 12C, together with the photoelectric conversion section 16. The image pickup device 10B is otherwise similar to the image pickup device 10 in terms of configuration, functions, and effects.

In the image pickup device 10B, it is possible to omit the interlayer insulating layer 12-3, and the interlayer insulating layer 12-4 having the depression section 12C is provided on the interlayer insulating layer 12-2. The lower electrode 24a is provided along the sidewall and the bottom of the depression section 12C in the interlayer insulating layer 12-4. The green storage layer 110G may be disposed at any position, and may be provided opposite the conductive plug 120b1 (FIG. 17), or may be provided on the same side as the conductive plug 120b1 (FIG. 1), with respect to the inorganic photoelectric conversion sections 11B and 11R.

The image pickup device 10B may be manufactured as follows, for example. First, the interlayer insulating layer 12-4 is formed, after the interlayer insulating layers 12-1 and 12-2 are formed in a manner similar to the image pickup device 10. Next, connection holes passing through the interlayer insulating layers 12-1, 12-2, and 12-4 are provided, and may be filled with, for example, tungsten. The conductive plugs 120a2 and 120b2 are thus formed. Subsequently, the depression section 12C may be formed in the interlayer insulating layer 12-4 by, for example, a photolithography technique. Specifically, after a resist pattern is formed on the interlayer insulating layer 12-4, dry etching of the interlayer insulating layer 12-4 is performed using the resist pattern as a mask. The remaining resist is removed by ashing or the like. After the depression section 12C is thus provided, films of the respective materials of the lower electrode 24a, the organic photoelectric conversion section 16, and the upper electrode 17 are formed in this order, at the respective positions facing the depression section 12C. For example, the films of the respective materials of the lower electrode 24a and the upper electrode 17 may be formed by sputtering, and the film of the material of the organic photoelectric conversion section 16 may be formed by vacuum deposition. Subsequently, these are simultaneously patterned using, for example, a photolithography technique, so that the lower electrode 24a, the organic photoelectric conversion section 16, and the upper electrode 17 are formed. The lower electrode 24a is electrically connected to the conductive plug 120a2. The patterning may be performed such that, for example, a resist pattern is formed on the upper electrode 17, dry etching is performed using the resist pattern as a mask, and the remaining resist is removed by ashing. After the upper electrode 17 is provided, the contact metal layer 19 may be formed using, for example, tungsten, and the contact metal layer 19 and the upper electrode 17 are electrically connected to each other. The contact metal layer 19 is electrically connected to the conductive plug 120b2. Next, the protective film 18 is formed on the entire surface of the semiconductor substrate 11. Subsequent process is similar to that of the image pickup device 10.

In this way, in the image pickup device 10B, the lower electrode 24a, the organic photoelectric conversion section 16, and the upper electrode 17 are allowed to be patterned in one photolithography process. Therefore, it is possible to manufacture the image pickup device 10B in a simple method, by reducing the number of steps.

(Modification 3)

Figure 18:
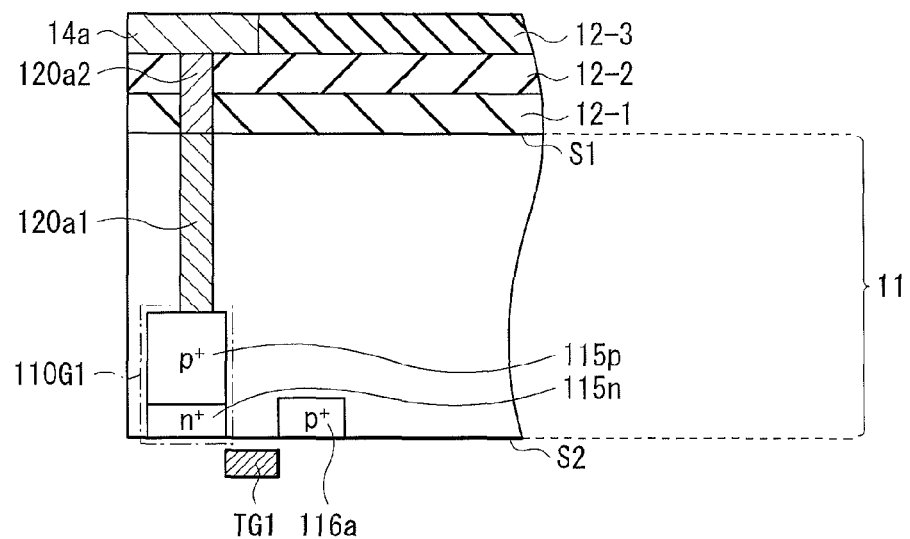
FIG. 18 is a cross-sectional diagram illustrating a configuration of an image pickup device according to a modification 3.

As illustrated in FIG. 18, a hole may be extracted from the lower electrode 14a as a signal charge, and stored in a green storage layer (a green storage layer 110G1) (a modification 3).

In the image pickup device 10 of this type, the configuration of each part on the surface S1 of the semiconductor substrate 11 is the same as that in the above-described embodiment, but the configuration of each of the green storage layer 110G1 and a floating diffusion (a FD 116a) in the semiconductor substrate 11 is different. In the green storage layer 110G1, the p-type region 115p of the hole storage layer is connected to the conductive plug 120a1, and the n-type region 115n of the electron storage layer is provided between the p-type region 115p and the surface S2 of the semiconductor substrate 11. The FD 116a is formed as a p-type region.

In the green storage layer 110G1, a hole is stored as follows. When the potential VL which is lower than that of the upper electrode 17 is applied to the lower electrode 14a, a hole of an electron-hole pair generated in the organic photoelectric conversion section 16 is guided to the lower electrode 14a. The hole is stored in the p-type region 115p of the green storage layer 110G, through the conductive plugs 120a1 and 120a2. In reading operation, the stored hole is transferred to the FD 116a.

(Modification 4)

Figure 19:
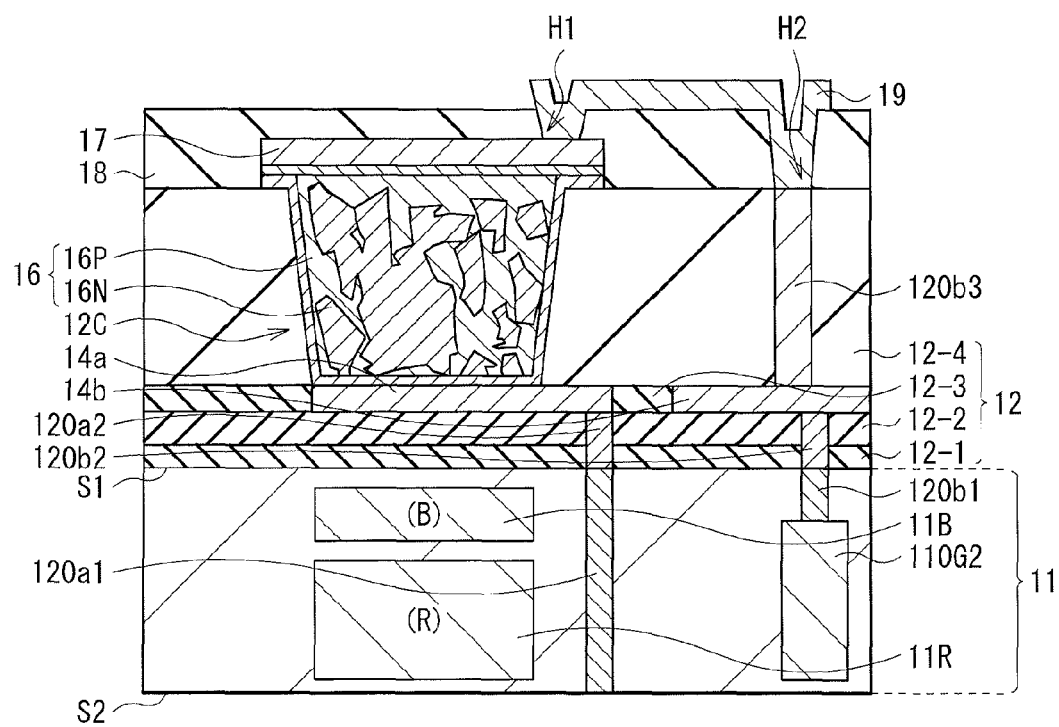
FIG. 19 is a cross-sectional diagram illustrating a configuration of an image pickup device according to a modification 4.

As illustrated in FIG. 19, a signal charge may be extracted from the upper electrode 17 (a modification 4).

In the image pickup device 10 of this type, a green storage layer (a green storage layer 110G2) in the semiconductor substrate 11 is connected to the conductive plug 120b1, and further electrically connected to the upper electrode 17 through the conductive plug 120b2, the wiring 14b, and the conductive plug 120b3. By configuring the green storage layer 110G2 and the floating diffusion in a manner similar to the above-described embodiment, an electron is allowed to be extracted from the upper electrode 17 as a signal charge, and stored in the green storage layer 110G2. In this case, an electric potential to be applied to the upper electrode 17 is set to be higher than an electric potential to be applied to the lower electrode 14a. A hole is discharged from the lower electrode 14a through the conductive plugs 120a1 and 120a2.

Alternatively, by configuring the green storage layer 110G2 and the floating diffusion in a manner similar to the modification 3, a hole is allowed to be extracted from the upper electrode 17 as a signal charge, and stored in the green storage layer 110G2. In this case, an electric potential to be applied to the upper electrode 17 is set to be lower than an electric potential to be applied to the lower electrode 14a. An electron is discharged from the lower electrode 14a through the conductive plugs 120a1 and 120a2.

APPLICATION EXAMPLE

FIG. 20 illustrates an overall configuration of a solid-state image pickup unit (the image pickup unit 1) in which any of the image pickup devices (the image pickup devices 10, 10A, and 10B) described in the embodiment and the modifications is used for each pixel. The image pickup unit 1 is a CMOS image sensor, and has a pixel section 1a as an image pickup area in a central part on the semiconductor substrate 11. In a peripheral region of the pixel section 1a, for example, a peripheral circuit section 130 that includes a row scanning section 131, a system control section 132, a horizontal selection section 133, and a column scanning section 134 may be provided.

The pixel section 1a may include, for example, the plurality of unit pixels P (corresponding to the image pickup devices 10, 10A, and 10B) arranged two-dimensionally in rows and columns. For the unit pixels P, for example, a pixel driving line Lread (specifically, a row selecting line and a reset control line) may be wired for every pixel row, and the vertical signal line Lsig may be wired for every pixel column. The pixel driving line Lread transmits a drive signal used to read a signal from a pixel. One end of the pixel driving line Lread is connected to an output terminal of the row scanning section 131, the output terminal corresponding to each row.

The row scanning section 131 may be, for example, a pixel driving section configured of a shift register, an address decoder, and the like, and driving each of the pixels P of the pixel section 1a row by row. The signal outputted from each of the pixels P in a pixel row selected by the row scanning section 131 is supplied to the horizontal selection section 133 through each of the vertical signal lines Lsig. The horizontal selection section 133 may be configured of, for example, an amplifier, a horizontal selecting switch, and the like provided for each of the vertical signal lines Lsig.

The column scanning section 134 is configured as a shift register, an address decoder, and the like, and performs sequential driving, while scanning each horizontal selecting switch of the horizontal selection section 133. A signal of each of the pixels P transmitted through each of the vertical signal lines Lsig is sequentially outputted to a horizontal signal line 135, through selection scanning performed by the column scanning section 134. The outputted signal is then transmitted to the outside of the semiconductor substrate 11 through the horizontal signal line 135.

A circuit part including the row scanning section 131, the horizontal selection section 133, the column scanning section 134, and the horizontal signal line 135 may be directly formed on the semiconductor substrate 11, or may be provided at an external control IC. The circuit part may be provided at other substrate connected by a cable or the like.

The system control section 132 receives a clock, operation-mode instructing data, and the like provided from outside of the semiconductor substrate 11, and also outputs internal information about the image pickup unit 1. Further, for example, the system control section 132 may include a timing generator that generates various timing signals, and may control driving of peripheral circuits such as the row scanning section 131, the horizontal selection section 133, and the column scanning section 134, based on the various timing signals generated by the timing generator.

Figure 21:
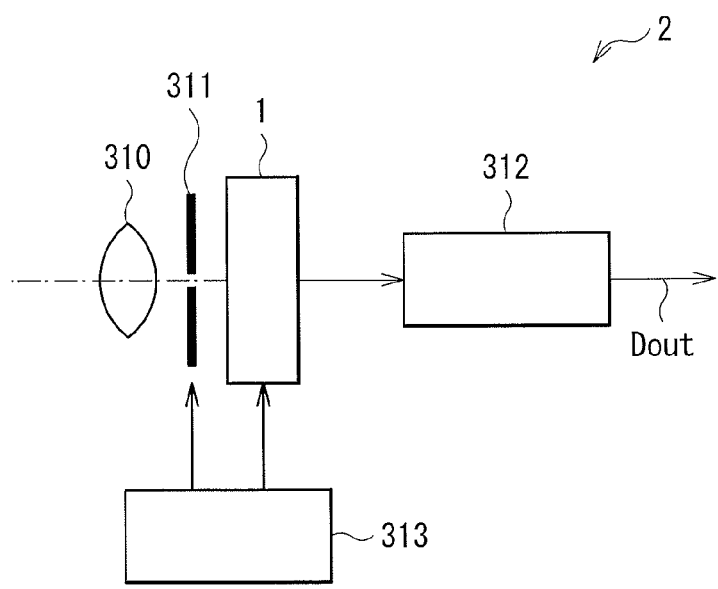
FIG. 21 is a diagram illustrating a schematic configuration of an electronic apparatus to which the image pickup unit illustrated in FIG. 20 is applied.

The image pickup unit 1 as described above may be mounted on all kinds of electronic apparatuses having an image pickup function. The image pickup unit 1 is applicable to, for example, camera systems such as digital still cameras and video cameras, portable telephones, and the like. FIG. 21 illustrates a schematic configuration of a camera (an electronic apparatus 2) as an example. The electronic apparatus 2 may be, for example, a video camera capable of shooting a still image or a moving image, and include the image pickup unit 1, an optical system (an optical lens) 310, a shutter unit 311, a signal processing section 312, and a drive section 313.

The optical system 310 guides image light (incident light) from a subject to the pixel section 1a of the image pickup unit 1. The optical system 310 may include a plurality of optical lenses. The shutter unit 311 controls an optical irradiation period and a shielding period for the image pickup unit 1. The drive section 313 controls shutter operation of the shutter unit 311 and transfer operation of the image pickup unit 1. The signal processing section 312 performs various kinds of signal processing on signals outputted from the image pickup unit 1. An image signal Dout after the signal processing is stored in a storage medium such as a memory, or outputted to a monitor or the like.

The present technology has been described with reference to the embodiment and the modifications, but is not limited thereto and may be variously modified. For example, in the above-described embodiment and the like, the case in which the organic photoelectric conversion section 16 detecting green light and the inorganic photoelectric conversion sections 11B and 11R detecting red light and blue light, respectively, are laminated has been described for each of the image pickup devices 10, 10A, and 10B. However, the present technology is not limited to this configuration. For example, red light or blue light may be detected by an organic photoelectric conversion section, or green light may be detected by an inorganic photoelectric conversion section. The number and ratio of the organic photoelectric conversion sections and the inorganic photoelectric conversion sections are not limited to those described above either. For example, two or more organic photoelectric conversion sections may be provided, and color signals of a plurality of colors may be obtained only by the organic photoelectric conversion sections. The photoelectric conversion sections (the organic photoelectric conversion section and the inorganic photoelectric conversion section) may not only be laminated in a vertical direction, but may be disposed in parallel along a semiconductor substrate surface.

In addition, in the above-described embodiment and the like, the configuration of each of the image pickup devices 10, 10A, and 10B of the backside-illumination type has been taken as an example, but the present technology is applicable to an image pickup device of a surface irradiation type.

Moreover, it is not necessary to provide all the elements described in the embodiment and the like, and other element may be provided.

It is to be noted that the present technology may be configured as follows.

(1) A solid-state image sensing device including:
a first insulating layer including a depression section; and
a first photoelectric conversion section filling the depression section.

(2) The solid-state image sensing device according to (1), wherein the first photoelectric conversion section is provided between a pair of electrodes facing each other in a depth direction of the depression section.

(3) The solid-state image sensing device according to (2), wherein the first photoelectric conversion section includes an organic photoelectric conversion material.

(4) The solid-state image sensing device according to (3), wherein the depression section is filled with the organic photoelectric conversion material.

(5) The solid-state image sensing device according to (3) or (4), wherein the organic photoelectric conversion material includes a first conductive semiconductor and a second conductive semiconductor.

(6) The solid-state image sensing device according to (5), wherein the first photoelectric conversion section includes, a first conductive semiconductor layer of the first conductive semiconductor, a second conductive semiconductor layer of the second conductive semiconductor, and a mixed layer including the first conductive semiconductor and the second conductive semiconductor, and one of the pair of electrodes is in contact with the first conductive semiconductor layer, and other of the pair of electrodes is in contact with the second conductive semiconductor layer.

(7) The solid-state image sensing device according to any one of (1) to (6), wherein the depression section has a tapered shape.

(8) The solid-state image sensing device according to any one of (2) to (7), wherein the first insulating layer and the first photoelectric conversion section are provided on a semiconductor substrate.

(9) The solid-state image sensing device according to (8), wherein a second photoelectric conversion section is provided in inside of the semiconductor substrate.

(10) The solid-state image sensing device according to (9), wherein a refractive index of the first photoelectric conversion section is higher than a refractive index of the first insulating layer, and the first photoelectric conversion section and the second photoelectric conversion section are disposed to overlap each other in a planar view.

(11) The solid-state image sensing device according to (10), wherein, a refractive index of one of the pair of electrodes is also higher than the refractive index of the first insulating layer, the one being provided between the semiconductor substrate and the first photoelectric conversion section.

(12) The solid-state image sensing device according to (11), wherein the one of the pair of electrodes is provided in the depression section.

(13) The solid-state image sensing device according to any one of (8) to (12), further including a second insulating layer including a hafnium oxide film between the semiconductor substrate and the first insulating layer.

(14) The solid-state image sensing device according to any one of (1) to (13), wherein the first photoelectric conversion section absorbs light in a specific wavelength region.

(15) The solid-state image sensing device according to (14), wherein the first photoelectric conversion section has transmittance of about 70% or more with respect to light outside the specific wavelength region.

(16) A solid-state image pickup unit including a solid-state image sensing device, the solid-state image sensing device including:

a first insulating layer including a depression section; and a first photoelectric conversion section filling the depression section.

[1] An image sensor, including:

a first insulating layer over a semiconductor substrate;

a depression section formed in the first insulating layer; and an organic photoelectric conversion section, wherein the organic photoelectric conversion section fills the depression section.

[2] The image sensor of [1], further including:

at least a first inorganic photoelectric conversion section formed in the semiconductor substrate, wherein the organic photoelectric conversion section overlaps the at least a first inorganic photoelectric conversion section.

[3] The image sensor of [2], wherein the depression section tapers from a side adjacent a light receiving side of the image sensor to a side adjacent the at least a first inorganic photoelectric conversion section.

[4] The image sensor of any one of [1] to [3], wherein the organic photoelectric conversion section includes a mixed layer that includes an n-type semiconductor and a p-type semiconductor.

[5] The image sensor of any one of [1] to [4], wherein the organic photoelectric conversion section includes multiple layers.

[6] The image sensor of any one of [1] to [5], wherein the organic photoelectric conversion section includes multiple layers, wherein a first one of the layers of the organic photoelectric conversion section is provided along a sidewall and a bottom surface of the depression section adjacent the semiconductor substrate.

[7] The image sensor of [6], wherein the first one of the layers of the organic photoelectric conversion section is an n-type semiconductor layer, wherein a second one of the layers of the organic photoelectric conversion section is a mixed layer that includes an n-type semiconductor and a p-type semiconductor, and wherein a third one of the layers of the organic photoelectric conversion section is a p-type semiconductor layer.

[8] The image sensor of any one of [2] to [7], further including:

a second inorganic photoelectric conversion section formed in the semiconductor substrate, wherein the organic photoelectric conversion section overlaps the first and second inorganic photoelectric conversion sections.

[9] The image sensor of any one of [1] to [8], further including:

an upper electrode in contact with a top surface of the organic photoelectric conversion section;

a lower electrode in contact with a lower surface of the organic photoelectric conversion section, wherein the lower electrode is between the organic photoelectric conversion section and the semiconductor substrate.

[10] The image sensor of [9], further including:

a storage layer, wherein the storage layer is formed in the semiconductor substrate, and wherein the storage layer is electrically interconnected to the lower electrode.

[11] The image sensor of any one of [1] to [10], further including:

a wiring layer, wherein the image sensor is a back illumination type image sensor in which the at least a first inorganic photoelectric conversion element is provided between a light receiving surface of the semiconductor substrate and the wiring layer.

[12] An image pickup device, including:

an on-chip lens;

a flattening layer, wherein the on-chip lens is provided on the flattening layer;

a solid-state image pickup device, including:

a first insulating layer over a semiconductor substrate;

a depression section formed in the first insulating layer;

an organic photoelectric conversion section, wherein the organic photoelectric conversion section fills the depression section.

[13] The image pickup device of [12], further including:

at least a first inorganic photoelectric conversion section formed in the semiconductor substrate, wherein the organic photoelectric conversion section overlaps the at least a first inorganic photoelectric conversion section, and wherein the flattening layer is interconnected to the solid-state image pickup device.

[14] The device of [12] or [13], wherein the depression section tapers from a side adjacent a light receiving side of the image sensor to a side adjacent the semiconductor substrate.

[15] The device of any one of [12] to [14] wherein the organic photoelectric conversion section includes a mixed layer that includes an n-type semiconductor and a p-type semiconductor.

[16] An electronic apparatus, including:

an optical system;

a shutter unit, wherein the shutter unit receives light from the optical system;

an image pickup unit, wherein the shutter unit controls an optical irradiation period for the image pickup unit, the image pickup unit including:

a first insulating layer over a semiconductor substrate;

a depression section formed in the first insulating layer;

an organic photoelectric conversion section, wherein the organic photoelectric conversion section fills the depression section;

a drive section, wherein the drive section is operable to control operation of the shutter unit and transfer operations of the image pickup unit;

a signal processing section, wherein the signal processing section is operable to perform signal processing on signals output from the image pickup unit.

[17] The electronic apparatus of [16], further including:

at least a first inorganic photoelectric conversion section formed in the semiconductor substrate, wherein the organic photoelectric conversion section overlaps the at least a first inorganic photoelectric conversion section.

[18] The apparatus of [16] or [17], wherein the depression section tapers from a side adjacent a light receiving side of the image sensor to a side adjacent the semiconductor substrate.

[19] The apparatus of any one of [16] to [18], wherein the organic photoelectric conversion section includes a mixed layer that includes an n-type semiconductor and a p-type semiconductor.

[20] The apparatus of any one of [16] to [19], wherein the organic photoelectric conversion section includes multiple layers.

[21] The apparatus of [20], wherein a first one of the layers of the organic photoelectric conversion section is provided along a sidewall and a bottom surface of the depression section adjacent the semiconductor surface.

The present disclosure contains subject matter related to that disclosed in Japanese Priority Patent Application JP 2012-282107 filed in the Japan Patent Office on Dec. 26, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Image pickup unit
10 Image pickup device
11 Semiconductor substrate
11B, 11R Inorganic photoelectric conversion section
12, 12-1, 12-2, 12-3, 12-4, 52 Interlayer insulating layer
12C Depression section
14a Lower electrode
14b, 51a Wiring
16 Organic photoelectric conversion section
17 Upper electrode
18 Protective film
19 Contact metal layer
21 Flattening layer
22 On-chip lens
51 Multilayered wiring layer
53 Supporting substrate
110 Silicon layer
110G, 110G1, 110G2 Green storage layer
120a1, 120a2, 120b1, 120b2, 120b3 Conductive plug
H1, H2 Connection hole

The invention claimed is:

1. An image sensor, comprising:
a first insulating layer over a semiconductor substrate;
a depression section formed in the first insulating layer; and
an organic photoelectric conversion section, wherein the organic photoelectric conversion section fills the depression section.

2. The image sensor of claim 1, further comprising:
at least a first inorganic photoelectric conversion section formed in the semiconductor substrate, wherein the organic photoelectric conversion section overlaps the at least a first inorganic photoelectric conversion section.

3. The image sensor of claim 2, wherein the depression section tapers from a side adjacent a light receiving side of the image sensor to a side adjacent the at least a first inorganic photoelectric conversion section.

4. The image sensor of claim 1, wherein the organic photoelectric conversion section includes a mixed layer that includes an n-type semiconductor and a p-type semiconductor.

5. The image sensor of claim 1, wherein the organic photoelectric conversion section includes multiple layers.

6. The image senor of claim 1, wherein the organic photoelectric conversion section includes multiple layers, wherein a first one of the layers of the organic photoelectric conversion section is provided along a sidewall and a bottom surface of the depression section adjacent the semiconductor substrate.

7. The image sensor of claim 6, wherein the first one of the layers of the organic photoelectric conversion section is an n-type semiconductor layer, wherein a second one of the layers of the organic photoelectric conversion section is a mixed layer that includes an n-type semiconductor and a p-type semiconductor, and wherein a third one of the layers of the organic photoelectric conversion section is a p-type semiconductor layer.

8. The image sensor of claim 2, further comprising:
a second inorganic photoelectric conversion section formed in the semiconductor substrate, wherein the organic photoelectric conversion section overlaps the first and second inorganic photoelectric conversion sections.

9. The image sensor of claim 1, further comprising:
an upper electrode in contact with a top surface of the organic photoelectric conversion section;
a lower electrode in contact with a lower surface of the organic photoelectric conversion section, wherein the lower electrode is between the organic photoelectric conversion section and the semiconductor substrate.

10. The image sensor of claim 9, further comprising:
a storage layer, wherein the storage layer is formed in the semiconductor substrate, and wherein the storage layer is electrically interconnected to the lower electrode.

11. The image sensor of claim 1, further comprising:
a wiring layer, wherein the image sensor is a back illumination type image sensor in which the at least a first inorganic photoelectric conversion element is provided between a light receiving surface of the semiconductor substrate and the wiring layer.

12. An image pickup device, comprising:
an on-chip lens;
a flattening layer, wherein the on-chip lens is provided on the flattening layer;
a solid-state image pickup device, including:
a first insulating layer over a semiconductor substrate;
a depression section formed in the first insulating layer;
an organic photoelectric conversion section, wherein the organic photoelectric conversion section fills the depression section.

13. The image pickup device of claim 12, further comprising:
at least a first inorganic photoelectric conversion section formed in the semiconductor substrate, wherein the organic photoelectric conversion section overlaps the at least a first inorganic photoelectric conversion section, and wherein the flattening layer is interconnected to the solid-state image pickup device.

14. The device of claim 12, wherein the depression section tapers from a side adjacent a light receiving side of the image sensor to a side adjacent the semiconductor substrate.

15. The device of claim 12, wherein the organic photoelectric conversion section includes a mixed layer that includes an n-type semiconductor and a p-type semiconductor.

16. An electronic apparatus, comprising:
an optical system;
a shutter unit, wherein the shutter unit receives light from the optical system;
an image pickup unit, wherein the shutter unit controls an optical irradiation period for the image pickup unit, the image pickup unit including:
a first insulating layer over a semiconductor substrate;
a depression section formed in the first insulating layer;
an organic photoelectric conversion section, wherein the organic photoelectric conversion section fills the depression section;
a drive section, wherein the drive section is operable to control operation of the shutter unit and transfer operations of the image pickup unit;
a signal processing section, wherein the signal processing section is operable to perform signal processing on signals output from the image pickup unit.

17. The electronic apparatus of claim 16, further comprising:
at least a first inorganic photoelectric conversion section formed in the semiconductor substrate, wherein the organic photoelectric conversion section overlaps the at least a first inorganic photoelectric conversion section.

18. The apparatus of claim 16, wherein the depression section tapers from a side adjacent a light receiving side of the image sensor to a side adjacent the semiconductor substrate.

19. The apparatus of claim 16, wherein the organic photoelectric conversion section includes a mixed layer that includes an n-type semiconductor and a p-type semiconductor.

20. The apparatus of claim 16, wherein the organic photoelectric conversion section includes multiple layers.

21. The apparatus of claim 20, wherein a first one of the layers of the organic photoelectric conversion section is provided along a sidewall and a bottom surface of the depression section adjacent the semiconductor surface.

* * * * *